US010935684B2

(12) United States Patent
Gu et al.

(10) Patent No.: US 10,935,684 B2
(45) Date of Patent: Mar. 2, 2021

(54) NEAR REAL-TIME RETURN-ON-FRACTURING-INVESTMENT OPTIMIZATION FOR FRACTURING SHALE AND TIGHT RESERVOIRS

(71) Applicant: HALLIBURTON ENERGY SERVICES, INC., Houston, TX (US)

(72) Inventors: Ming Gu, Atascocita, TX (US); John Andrew Quirein, Williamson, TX (US); Dingding Chen, Tomball, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 243 days.

(21) Appl. No.: 15/760,694

(22) PCT Filed: Oct. 24, 2016

(86) PCT No.: PCT/US2016/058485
§ 371 (c)(1),
(2) Date: Mar. 16, 2018

(87) PCT Pub. No.: WO2017/074869
PCT Pub. Date: May 4, 2017

(65) Prior Publication Data
US 2018/0259668 A1      Sep. 13, 2018

Related U.S. Application Data

(60) Provisional application No. 62/247,591, filed on Oct. 28, 2015.

(51) Int. Cl.
*G01V 1/50* (2006.01)
*E21B 43/26* (2006.01)
(Continued)

(52) U.S. Cl.
CPC ............... *G01V 1/50* (2013.01); *E21B 43/26* (2013.01); *E21B 44/00* (2013.01); *G01V 1/40* (2013.01);
(Continued)

(58) Field of Classification Search
CPC .. E21B 2041/0028; E21B 44/00; E21B 43/26; G06F 30/20; G01V 2200/16;
(Continued)

(56) References Cited

U.S. PATENT DOCUMENTS 5,205,164 A     4/1993  Steiger et al.
2003/0050758 A1  3/2003  Soliman et al.
(Continued)

OTHER PUBLICATIONS

Jing Huang et al., Well Performance Simulation and Parametric Study for DifferentRefracturing Scenarios in Shale Reservoir, Aug. 23, 2018, Hindawi, Geofluids, vol. 2018, Article ID 4763414, pp. 1-13 (Year: 2018).*

(Continued)

*Primary Examiner* — Mischita L Henson
(74) *Attorney, Agent, or Firm* — Polsinelli PC

(57) ABSTRACT

Near real-time methodologies for maximizing return-on-fracturing-investment for shale fracturing. An example system can calculate, based on sonic data and density data, mechanical properties and closure stress of a portion of shale rocks for fracture modeling. The system can generate one or more rock mechanical models based on the mechanical properties and closure stress of the portion of shale rocks, and perform one or more fracture modeling simulations based on one or more treatment parameter values. Based on the one or more fracture modeling simulations, the system can generate a neural network model which predicts a fracture productivity indicator of an effective propped area (EPA) and/or an effective propped length (EPL), and calcu- (Continued)

late a return-on-fracturing-investment (ROFI) based on the EPA or EPL predicted by the neural network model.

19 Claims, 15 Drawing Sheets

(51) Int. Cl.
  *G01V 1/40*     (2006.01)
  *G06F 30/20*     (2020.01)
  *E21B 44/00*     (2006.01)
  *G01V 1/48*     (2006.01)

(52) U.S. Cl.
  CPC .......... *G06F 30/20* (2020.01); *E21B 2200/22* (2020.05); *G01V 1/48* (2013.01); *G01V 2200/16* (2013.01); *G01V 2210/586* (2013.01); *G01V 2210/6169* (2013.01); *G01V 2210/626* (2013.01); *G01V 2210/646* (2013.01)

(58) Field of Classification Search
  CPC ...... G01V 1/50; G01V 1/48; G01V 2210/586; G01V 2210/6169; G01V 2210/626; G01V 2210/646; G01V 1/40
  See application file for complete search history.

(56) References Cited

U.S. PATENT DOCUMENTS

| | | | |
|---|---|---|---|
| 2005/0216198 A1* | 9/2005 | Craig | ................... E21B 49/008 702/12 |
| 2012/0185225 A1 | 7/2012 | Onda et al. | |
| 2013/0270011 A1 | 10/2013 | Akkurt et al. | |
| 2013/0341024 A1* | 12/2013 | Fonseca | ................ E21B 43/261 166/281 |
| 2014/0067353 A1 | 3/2014 | Shelley et al. | |
| 2014/0369165 A1 | 12/2014 | Sinha | |
| 2015/0204174 A1 | 7/2015 | Kresse et al. | |
| 2015/0377005 A1* | 12/2015 | Garcia-Teijeiro | .... G01V 99/005 703/10 |
| 2016/0291181 A1* | 10/2016 | Sinha | ..................... G01V 1/306 |
| 2017/0205531 A1* | 7/2017 | Berard | ................... G01V 11/00 |
| 2018/0216441 A1* | 8/2018 | Gu | ......................... E21B 43/26 |

OTHER PUBLICATIONS

OspreyData, Parametric Analysis in Well Modeling, 2020, OspreyData, pp. 1-2, accessed online Jul. 11, 2020 https://www.ospreydata.com/2020/01/13/parametric-analysis-in-well-modeling/ (Year: 2020).*

International Search Report and Written Opinion; PCT Application No. PCT/US2016/058485; dated Jan. 26, 2017.

Phatak, A., Kresse, O., Nevvonen, O. V., Abad, C., Cohen, C., Lafitte, V. et al; England, K. W. (Feb. 4, 2013); "Optimum Fluid and Proppant Selection for Hydraulic Fracturing in Shale Gas Reservoirs: a Parametric Study Based on Fracturing-to-Production Simulations" ; Society of Petroleum Engineers.

* cited by examiner

NEAR REAL-TIME
RETURN-ON-FRACTURING-INVESTMENT
OPTIMIZATION FOR FRACTURING SHALE
AND TIGHT RESERVOIRS

CROSS-REFERENCE

The present application claims the benefit of U.S. Provisional Application No. 62/247,591, filed Oct. 28, 2015, which is hereby incorporated by reference in its entirety. This application is a national stage entry of PCT/US2016/058485 filed Oct. 24, 2016, said application is expressly incorporated herein in its entirety.

BACKGROUND

1. Technical Field

The present disclosure relates to optimization of return-on-fracturing investment (ROFI) for shale fracturing.

2. Introduction

Multi-fracturing along a horizontal well is important for commercially-viable production from low permeability formations, such as shales. In ultra-low permeability shale, the effective propped area (EPA) dominates the short-term fracture productivity. For a transient flow region and a fully propped pay interval, EPA can be reduced to effective propped length (EPL). Due to a significant decline in production within a short time, the short-term production performance of the fractures is given more attention by operators than the long-term. Accordingly, the EPA or EPL is often used as an optimization target for a fracturing treatment. The EPA is highly affected by varied fracturing treatment parameters such as perforation depth, pumping rate, total slurry volume, fluid viscosity, proppant concentration, and so on. For short-term production, the treatment cost plays a role for ROFI optimization.

The laminated or platy nature of shale leads to different mechanical properties along the vertical and horizontal directions. This anisotropy of rock elasticity and the closure stress makes fracture prediction in shales more complex, and traditional methods to predict fracture geometry assuming isotropy prove to be inadequate. The current analytical solutions assume a constant fracture height and constant mechanical properties for the entire height. Common 3D fracture modeling software are based on isotropic rock models, and models that take anisotropy into account are computationally expensive and time consuming, especially when a large number of simulations must be performed by varying the input fracturing treatment parameters for parametric study.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Figure 1A:
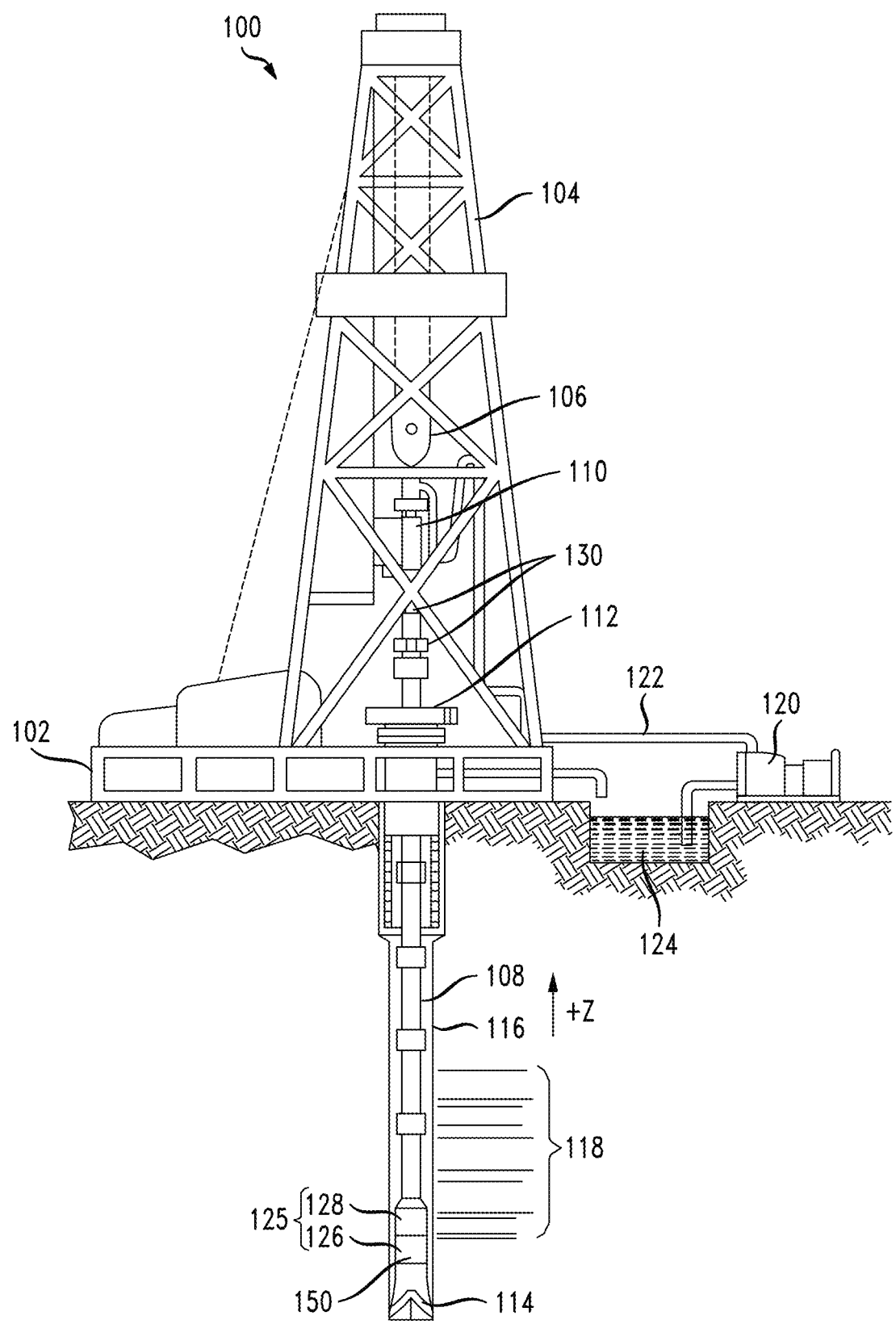
FIG. 1A illustrates a diagrammatic view of a logging while drilling (LWD) wellbore operating environment.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Overview

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

The approaches set forth herein provide near real-time solutions for fracturing design optimization. The workflows herein can integrate anisotropic acoustic interpretation, 3D fracture modeling, supervised machine learning (e.g., neural networks), and the theory of linear transient flow and boundary dominant flow. The acoustic log interpretation results can be used to build the rock mechanical models in a 3D fracture simulator. A neural network can be generated by using a limited number of 3D fracture modeling cases. The fracture geometry and proppant distribution predicted from the neural network can be used to predict the return-on-fracturing-investment (ROFI) as a function of production time based on the analytical solutions for the linear transient flow regime and boundary dominant flow regime.

After the neural network model is obtained from pilot or offset wells, it can be embedded into current completion/fracturing design software to identify geologic sweet spots, predict fracture propagation, and optimize fracture design instantaneously for other wells in the same geological area. To optimize the ROFI, the system can study or analyze the effect of many different parameters on fracture propagation and production, such as geomechanical properties, petrophysical properties, and fracturing treatment parameters. The parametric study results can be obtained for one well but also applied to other wells.

The disclosed workflow, which combines the anisotropic acoustic interpretation, 3D fracture modeling and neural networks, can be used for multi-variable analysis to better understand how the fractured well performance is affected by different fracturing treatment parameters. With the workflow, a limited number of modeling cases is needed for training and validating a neural network. Once the neural network is trained from a pilot well, the neural network model can be easily used to provide near-real time solutions for fracture characterization and production/ROFI optimizations for any other wells in the same geological area.

Disclosed are systems and methods for near real-time maximizing of ROFI for shale fracturing. An example system can calculate, based on sonic data and density data, mechanical properties and closure stress of a portion of shale rocks for fracture modeling. The system can also generate one or more rock mechanical models based on the mechanical properties and closure stress of the portion of shale rocks, and perform one or more fracture modeling simulations based on one or more treatment parameter values, such as slurry injection rate, a total slurry volume, a perforation depth, etc.

Based on the one or more fracture modeling simulations, the system can generate a neural network model which predicts a fracture productivity indicator of an effective propped area (EPA) and/or an effective propped length (EPL). A planer fracture simulator or a complex fracture simulator accounting for natural fractures (e.g., finite element analysis (FEA) model) can be used to generate the simulation training database.

The system can further calculate a return-on-fracturing-investment (ROFI) based on the EPA or EPL predicted by the neural network model. The ROFI can be used to generate a parametric study for other wells in the same geological area in real-time or near real-time. The parametric study can guide the optimization of the fracturing design.

DESCRIPTION

Various embodiments of the disclosure are described in detail below. While specific implementations are described, it should be understood that this is done for illustration purposes only. Other components and configurations may be used without parting from the spirit and scope of the disclosure. Moreover, it should be understood that features or configurations herein with reference to one embodiment or example can be implemented in, or combined with, other embodiments or examples herein. That is, terms such as "embodiment", "variation", "aspect", "example", "configuration", "implementation", "case", and any other terms which may connote an embodiment, as used herein to describe specific features or configurations, are not intended to limit any of the associated features or configurations to a specific or separate embodiment or embodiments, and should not be interpreted to suggest that such features or configurations cannot be combined with features or configurations described with reference to other embodiments, variations, aspects, examples, configurations, implementations, cases, and so forth. In other words, features described herein with reference to a specific example (e.g., embodiment, variation, aspect, configuration, implementation, case, etc.) can be combined with features described with reference to another example. Precisely, one of ordinary skill in the art will readily recognize that the various embodiments or examples described herein, and their associated features, can be combined with each other.

The disclosed technology addresses the need in the art for improved Return-On-Fracturing-Investment (ROFI) for shale fracturing. Disclosed are technologies for a near real-time methodology of maximizing Return-On-Fracturing-Investment (ROFI) for shale fracturing. The disclosure herein can be used to generate a large sensitivity study for locating "sweet spots" to place perforation clusters and selecting optimal hydraulic fracturing treatment parameters in order to produce the best ROFI for the target fractured wells.

Figure 1B:
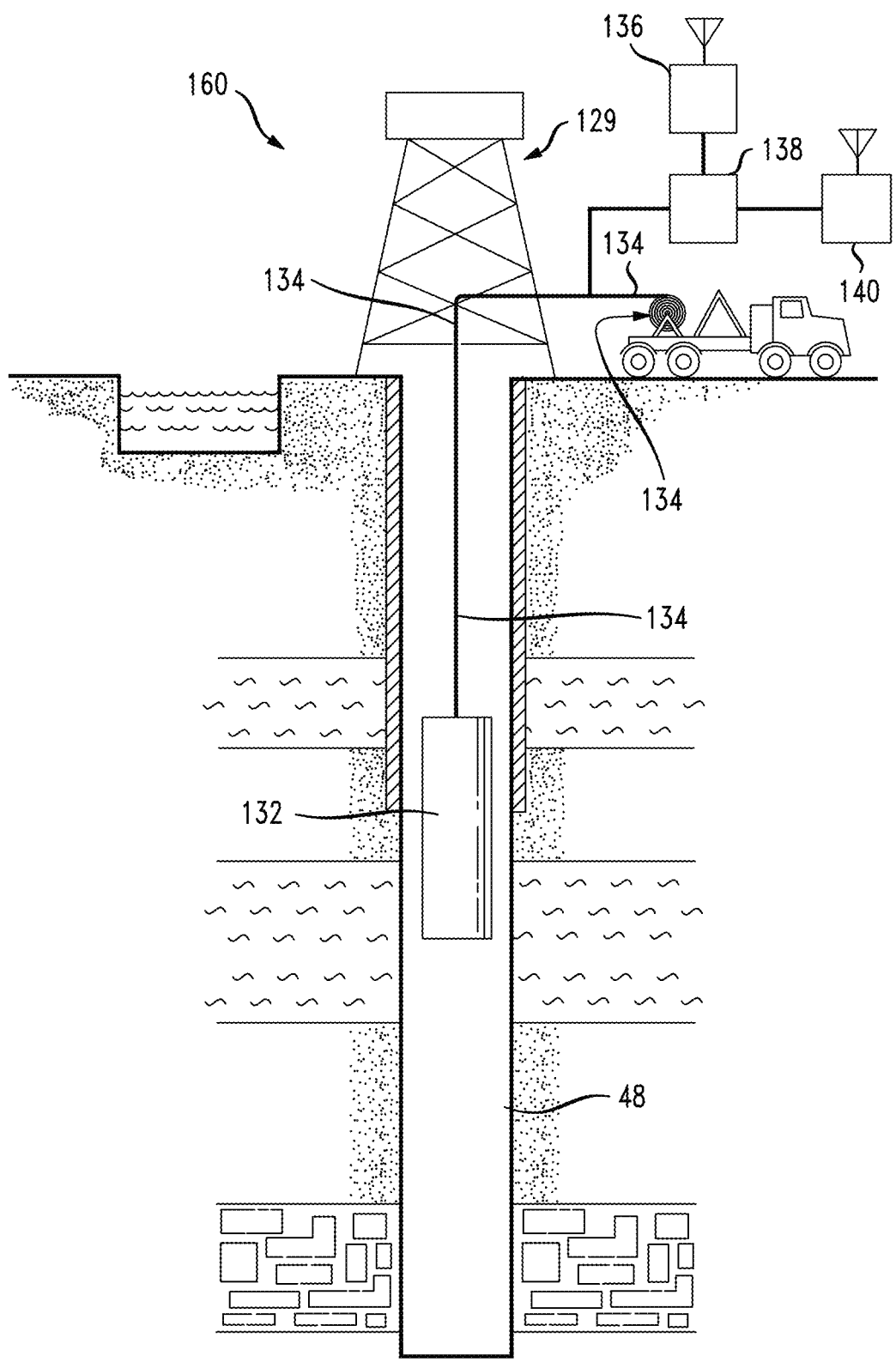
FIG. 1B illustrates a schematic diagram of an example system for downhole wireline logging operations in a downhole environment having tubulars.
Figure 6:
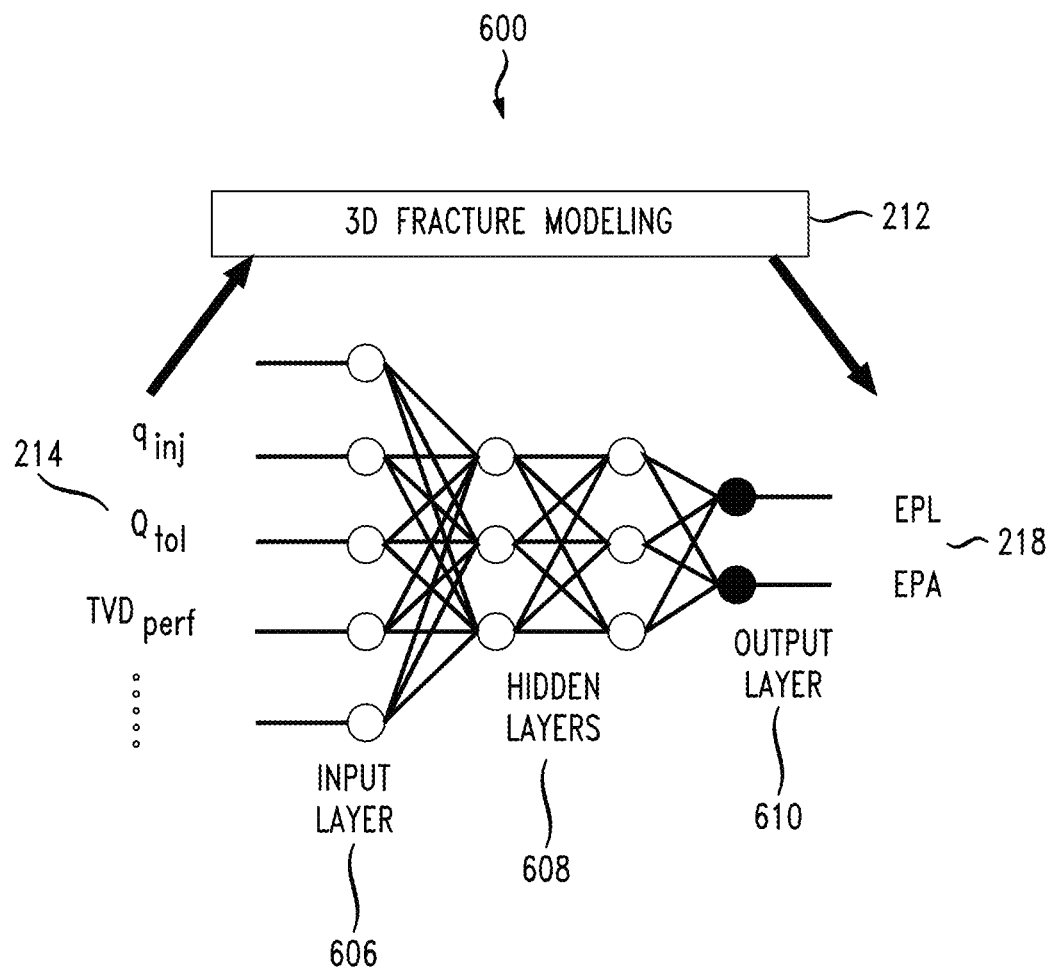
FIG. 6 illustrates a neural network trained by the 3D fracture modeling result.

A description of a general environment, as illustrated in FIGS. 1A and 1B, is first disclosed herein. A discussion of near real-time optimization of ROFI for fracturing shale and tight reservoirs will then follow. The discussion then concludes with a brief description of example devices, as illustrated in FIG. 6. These variations shall be described herein as the various embodiments are set forth. The disclosure now turns to FIGS. 1A and 1B.

FIG. 1A illustrates a diagrammatic view of a logging while drilling (LWD) wellbore operating environment 100 in which the presently disclosed apparatus, method, and system, may be deployed in accordance with certain exemplary embodiments of the present disclosure. As depicted in FIG. 1A, a drilling platform 102 is equipped with a derrick 104 that supports a hoist 106 for raising and lowering a drill string 108. The hoist 106 suspends a top drive 110 suitable for rotating the drill string 108 and lowering the drill string 108 through the well head 112. Connected to the lower end of the drill string 108 is a drill bit 114. As the drill bit 114 rotates, the drill bit 114 creates a wellbore 116 that passes through various formations 118. A pump 120 circulates drilling fluid through a supply pipe 122 to top drive 110, down through the interior of drill string 108, through orifices in drill bit 114, back to the surface via the annulus around drill string 108, and into a retention pit 124. The drilling fluid transports cuttings from the wellbore 116 into the pit 124 and aids in maintaining the integrity of the wellbore 116. Various materials can be used for drilling fluid, including oil-based fluids and water-based fluids.

Logging tools 126 can be integrated into the bottom-hole assembly 125 near the drill bit 114. As the drill bit 114 extends the wellbore 116 through the formations 118, logging tools 126 collect measurements relating to various formation properties as well as the orientation of the tool and various other drilling conditions, and may include density logging tools, as well as acoustic and sonic logging tools. The bottom-hole assembly 125 may also include a telemetry sub 128 to transfer measurement data to a surface receiver 130 and to receive commands from the surface. In at least some cases, the telemetry sub 128 communicates with a surface receiver 130 using mud pulse telemetry. In some instances, the telemetry sub 128 does not communicate with the surface, but rather stores logging data for later retrieval at the surface when the logging assembly is recovered.

Each of the logging tools 126 may include a plurality of tool components, spaced apart from each other, and communicatively coupled with one or more wires. The logging tools 126 may also include one or more computing devices 150 communicatively coupled with one or more of the plurality of tool components by one or more wires. The computing device 150 may be configured to control or monitor the performance of the tool, process logging data, and/or carry out the methods of the present disclosure.

In at least some instances, one or more of the logging tools 126 may communicate with a surface receiver 130 by a wire, such as wired drillpipe. In other cases, the one or more of the logging tools 126 may communicate with a surface receiver 130 by wireless signal transmission. In at least some cases, one or more of the logging tools 126 may receive electrical power from a wire that extends to the surface, including wires extending through a wired drillpipe.

Referring to FIG. 1B, a tool having tool body 132 can be employed with "wireline" systems, in order to carry out logging or other operations. For example, after drilling (such as in FIG. 1A), the drill string may be removed and tool body 132 lowered into the wellbore 48 by wireline conveyance 134 as shown in FIG. 1B. The tool body 132 which may contain sensors or other tools and instrumentation for detecting and logging nearby characteristics and conditions of the wellbore and surrounding formation, and may include density logging tools, as well as acoustic and sonic logging tools. The wireline conveyance 134 can be anchored in the drill rig 129 or portable means such as a truck. The wireline conveyance 134 can include one or more wires, slicklines, cables, or the like, as well as tubular conveyances such as coiled tubing, joint tubing, or other tubulars.

The illustrated wireline conveyance 134 provides support for the tool, as well as enabling communication between the tool processors on the surface and providing a power supply. The wireline conveyance 134 can include fiber optic cabling for carrying out communications. The wireline conveyance 134 is sufficiently strong and flexible to tether the tool body 132 through the wellbore 48, while also permitting communication through the wireline conveyance 134 to local processor 138 and/or remote processors 136, 140. Additionally, power can be supplied via the wireline conveyance 134 to meet power requirements of the tool. For slickline or coiled tubing configurations, power can be supplied downhole with a battery or via a downhole generator.

Figure 2:
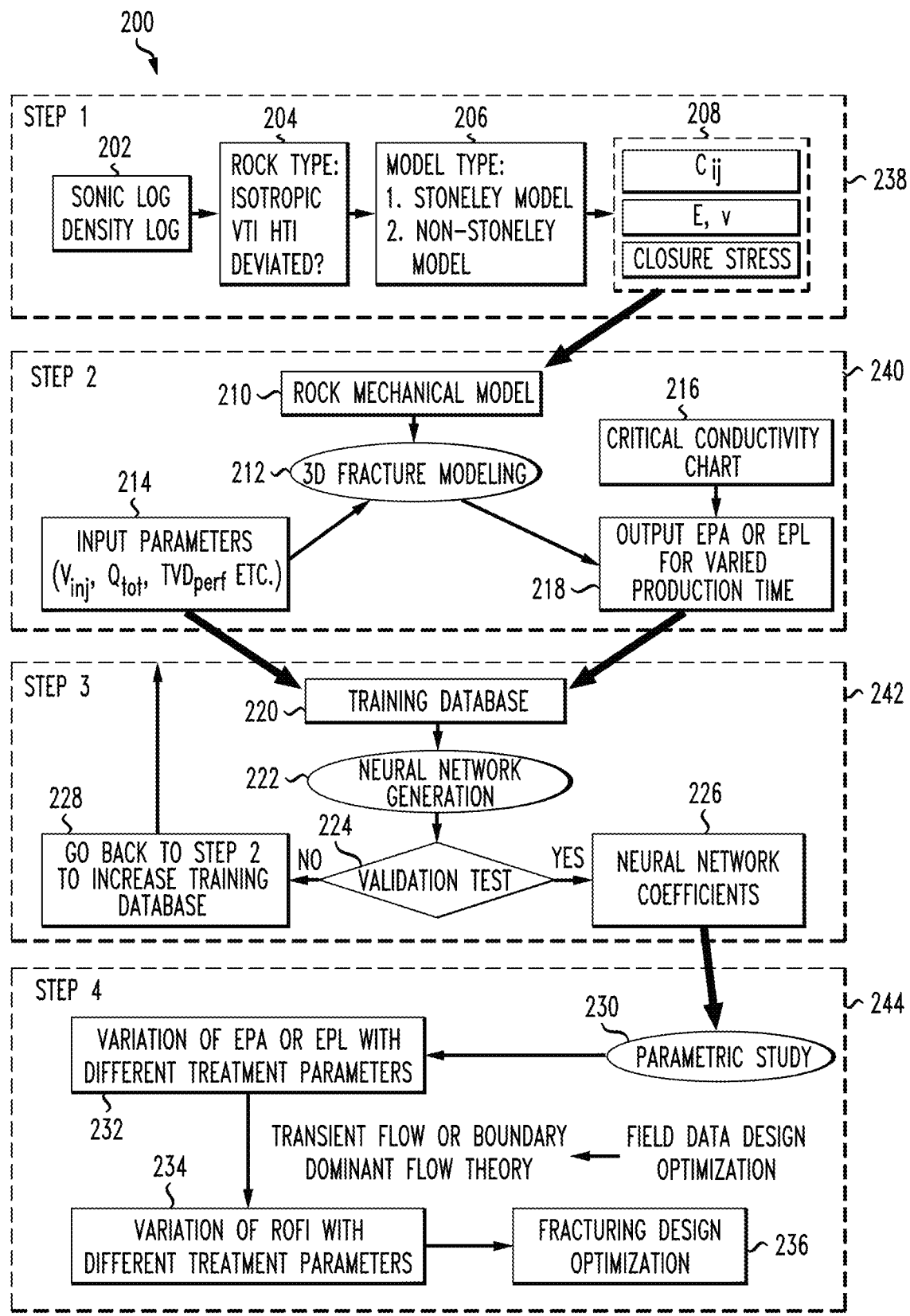
FIG. 2 illustrates an example workflow for fracture design optimization.

FIG. 2 illustrates an example fracturing design optimization workflow 200. The workflow 200 can integrate acoustic anisotropy interpretation, 3D fracture modeling, and neural network training. As illustrated, the workflow 200 is divided into four steps (238-244).

Step 1 (238)

In the first step (238), the computing system can obtain sonic log and/or density log data (202) and determine a rock type (204), which can include, for example isotropic, vertical transverse isotropic, horizontal transverse isotropic, etc. The system can select a model type (206) and calculate the properties of the rock (208).

Horizontal and vertical dynamic elastic moduli can be estimated by different anisotropic acoustic models in conjunction with well log sonic/density data. Shale rocks are vertically transverse isotropic medium, which is isotropic along the bedding plane direction and anisotropic in the plane orthogonal to the bedding plane. Therefore, fully characterizing its mechanical properties can involve the prediction of five independent stiffness coefficients. Sonic tools can only measure two or three of the stiffness coefficients. Accordingly, empirical acoustic models can be utilized to predict the remaining coefficients.

Figure 3A:
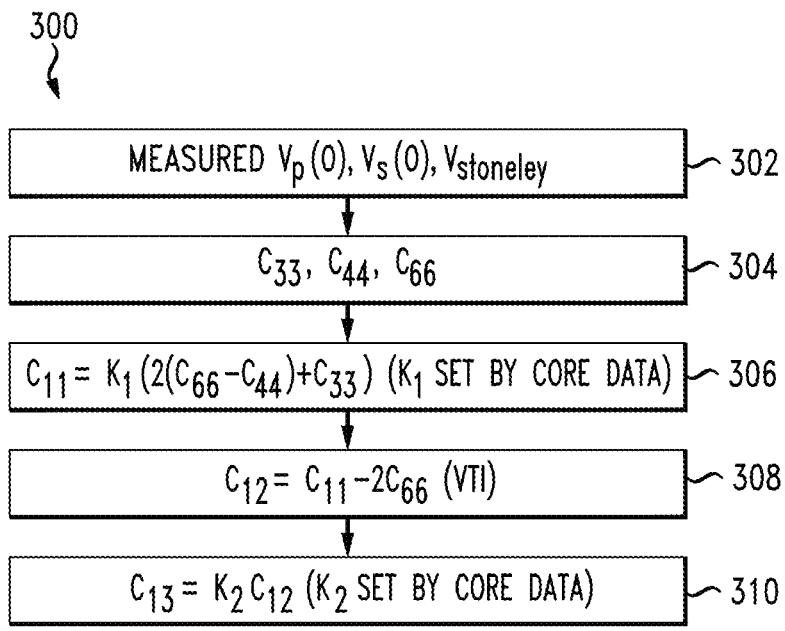
FIG. 3A. illustrates an example workflow of M-ANNE 1.

Based on the availability or the data quality of Stoneley wave velocity, one can choose Stoneley methods like ANNIE and M-ANNIE 1 or non-Stoneley methods like V-reg, M-ANNEI 2 and a combination model. FIG. 3A illustrates a workflow 300 for a Stoneley methods (M-ANNIE1) model and FIG. 3B illustrates the workflow 320 for a-non Stoneley methods (V-reg) model applied in the vertical wells.

Figure 3B:
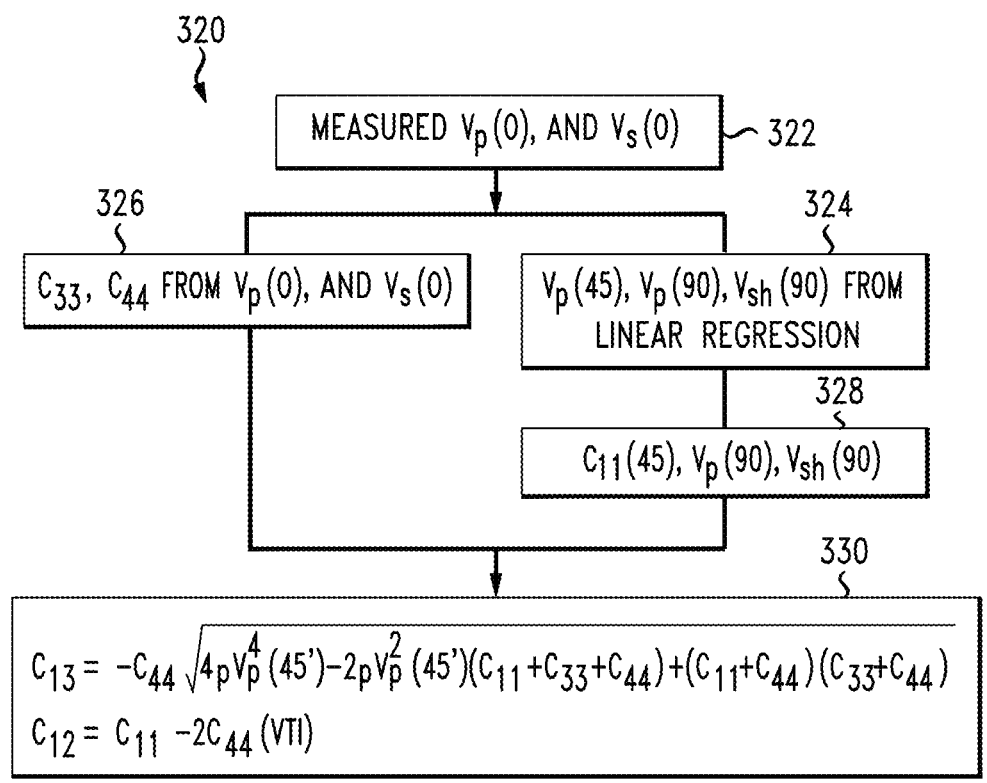
FIG. 3B illustrates an example workflow of V-reg.

Referring to the workflows in FIGS. 3A and 3B, $C_{33}$, $C_{44}$, $C_{66}$, $C_{11}$ and $C_{13}$ are five independent stiffness coefficients for the models. In FIG. 3A, the workflow 300 can involve measuring Vp and Vs at step 302. Vp and Vs are compressional and shear wave velocities. The velocity angle is the angle between the wave propagation direction and the shale bedding direction. For explanation purposes and the sake of simplicity, it is assumed herein that shale bedding plane extends horizontally. Accordingly, the angle of 0 degrees represents the vertical direction and 90 degrees represents the horizontal direction.

The workflow 300 can involve, as further described below, calculating $C_{33}$, $C_{44}$, and $C_{66}$ at step 304, calculating $C_{ii}$ at step 306, calculating $C_{12}$ at step 308, and calculating $C_{13}$ at step 310.

In a vertical well, $C_{33}$ and $C_{44}$ can be calculated from the acoustic tool measured Vp(0) and Vs(0). Referring to FIG. 3B, the workflow 320 can involve measuring Vp and Vs at step 322 and calculating $C_{33}$ and $C_{44}$ at step 326 from the acoustic tool measured Vp(0) and Vs(0). At step 324, the workflow 320 can involve constructing Vp(45), Vp(90) and Vsh(90) from Vp(0) and Vs(0), and at step 328 the workflow 320 can involve calculating $C_{11}$ and $C_{66}$ from Vp(90) and Vsh(90). At step 330, the workflow 320 can then involve calculating $C_{13}$ and $C_{12}$ based on the data from steps 322-328, as further explained below.

As previously explained, $C_{33}$ and $C_{44}$ are calculated from the acoustic tool measured Vp(0) and Vs(0). For the M-ANNIE1 workflow 300 $C_{66}$ is estimated from the Stoneley wave velocity. Two empirical correlations can be employed to obtain $C_{11}$ and $C_{13}$. For V-reg workflow 320, the Vp(45), Vp(90) and Vsh(90) are constructed from Vp(0) and Vs(0) based on their linear relationships obtained from core ultra-sonic data. The parameters $K_1$ and $K_2$ in M-ANNIE1 workflow 300 and the velocity linear correlation parameters adopted in V-reg workflow 320 are empirical parameters, which can use either field specific or generic values.

If ultra-sonic core data is available, they can be directly determined from the core data. If core data is missing, the generic values shown in the table below (Table 1) can be used. The generic parameters can be obtained from a published multi-shale datasets covering ten different shales inside and outside.

Table 1 below provides example generic parameters for the M-ANNIE 1 workflow 300 and V-reg workflow 320:

| M-ANNIE 1 | | V-reg $V^*_\alpha(\theta) = k_{\alpha,\theta} V_\alpha(0) + c_{\alpha,\theta}$ | |
|---|---|---|---|
| | | $k_{\alpha,\theta}$ | $c_{\alpha,\theta}$ |
| K1 | 1.1 | $\alpha = p, \theta = 45$ | 0.919 0.618 |
| K2 | 0.8 | $\alpha = p, \theta = 90$ | 0.862 1.332 |
| | | $\alpha = sh, \theta = 90$ | 0.847 0.816 |

*wave velocity is in km/s.

The acoustic models introduced above can be applied for the horizontal well with slight modifications. For the deviated wells, the velocity measured from the sonic tool is between the V(0) and V(90), and varies with the well deviation angle. Methods to characterize the stiffness tensor from the sonic data measured from the deviated wells are described herein. There are also analytical expressions for wave velocities in a general direction in a transversely anisotropic material. Vp(θ) and Vsv(θ) are functions of ε, δ, Vp(0), Vs(0) and θ, whereas Vsh(θ) is a function of γ, Vs(0) and θ.

$$v_p(\theta) = v_p(0)[1 + \varepsilon \sin^2\theta + D]^{1/2} \quad \text{(Equation 1)}$$

$$v_{sv}(\theta) = v_s(0)\left[1 + \frac{v_p(0)}{v_s(0)}\varepsilon\sin^2\theta - \frac{v_p(0)}{v_s(0)}D\right]^{1/2} \quad \text{(Equation 2)}$$

$$v_p(\theta) = v_s(0)[1 + 2\gamma\sin^2\theta]^{1/2} \quad \text{(Equation 3)}$$

In equations (1)-(3), D is a specific function of Vp0/Vs0, ε, δ, and θ. The parameters ε, δ, and γ are Thomsen parameters, in which ε and γ describe the Vp and Vsh anisotropy, and δ impacts the angular dependence of Vp and Vsv.

The sonic wave slowness is a function of mineralogy, porosity, saturated fluid and overburden stress. Accordingly, the equations below (equations 4 and 5) can be used to predict the compressional wave slowness DTC and shear wave slowness DTS at any TVD. The slowness is the inverse of the velocity (DTC=1/Vp, DTS=1/Vs).

$$DTC_0(TVD) = \quad \text{(Equation 4)}$$
$$DTC_0(TVD_{ref}) + DTC_{0,clay}*\Delta V_{clay} + DTC_{0,carb}*\Delta V_{carb} +$$
$$DTC_{0,quartz}*\Delta V_{quartz} + DTC_{0,TOC}*\Delta V_{TOC} +$$
$$DTC_{0,water}*\Delta V_{water} + DTC_{0,hc}*\Delta V_{hc} + a_{DTC}*\Delta \sigma_v$$

$$DTS_0(TVD) = \quad \text{(Equation 5)}$$
$$DTS_0(TVD_{ref}) + DTS_{0,clay}*\Delta V_{clay} + DTS_{0,carb}*\Delta V_{carb} +$$
$$DTS_{0,quartz}*\Delta V_{quartz} + DTS_{0,TOC}*\Delta V_{TOC} +$$
$$DTS_{0,water}*\Delta V_{water} + DTS_{0,hc}*\Delta V_{hc} + a_{DTS}*\Delta \sigma_v$$

In equations (4) and (5), vertical DTC and DTS at TVD are predicted from the vertical DTC and DTS at a reference depth TVD$_{ref}$ corrected by the discrepancy between mineralogy, fluid volume and stress. The reference sonic wave slowness value is measured at a nearest depth with a deviation angle smaller than 10 degree. ΔV is the volume percentage of the mineralogy and fluid at TVD minus the volume percentage at TVD$_{ref}$. Δσ$_v$ is the overburden stress at TVD minus the overburden stress at TVD$_{ref}$. All the variables from equations (4, 5) can be determined from the triple-combo logs and geochem logs, except parameters α$_{DTC}$ and α$_{DTS}$, which can only be obtained by data fitting.

The platy nature of clay and kerogen is the primary reason for the shale anisotropy. Accordingly, the unknown Thomsen parameters ε and γ at TVD can also be predicted from the values at TVD$_{ref}$ corrected by the discrepancy between clay and kerogen volume, as shown by equations (6) and (7). The reference ε and γ values are from the same reference depth as the reference DTC$_0$ and DTS$_0$.

$$\varepsilon(TVD)=\varepsilon(TVD_{ref})+b_\varepsilon*\Delta V_{clay}+c_\varepsilon*\Delta V_{TOC} \quad \text{(Equation 6)}$$

$$\gamma(TVD)=\gamma(TVD_{ref})+b_\gamma*\Delta V_{clay}+c_\gamma*\Delta V_{TOC} \quad \text{(Equation 7)}$$

In the above equations, b and c are unknown coefficients determined by data fitting. Due to the poor correlation of the Thomsen parameter δ with the other two Thomsen parameters, it is assumed to be a constant for simplicity. By substituting equations (4-7) into the equations (1-3), Vp(θ), Vsv(θ), and Vsh(θ) are predicted and compared with the log measurements. The nonlinear least squares curve fitting can be conducted to solve for the parameters: α$_{DTC}$, α$_{DTS}$, b$_\varepsilon$, b$_\gamma$, c$_\varepsilon$, c$_\gamma$, and δ. The fitting parameters are then substituted back to the equations (1-3) to calculate Vp(0), Vp(90), Vs(0), Vsh(90), and Vp(or sv)(45), which will be further utilized to predict C$_{33}$, C$_{11}$, C$_{44}$, C$_{66}$, and C$_{13}$, respectively.

After predicting the stiffness coefficients, the dynamic elastic moduli can be determined in both the vertical and horizontal directions using equations (8-11).

$$E_{vert} = C_{33} - \frac{2C_{13}^2}{C_{11}+C_{12}} \quad \text{(Equation 8)}$$

$$E_{horz} = \frac{(C_{11}-C_{12})*(C_{11}C_{33}-2C_{13}^2+C_{12}C_{33})}{C_{11}C_{33}-C_{13}^2} \quad \text{(Equation 9)}$$

$$v_{vert} = \frac{C_{13}}{C_{11}+C_{12}} \quad \text{(Equation 10)}$$

$$v_{horz} = \frac{C_{33}C_{12}-C_{13}^2}{C_{33}C_{11}-C_{13}^2} \quad \text{(Equation 11)}$$

The dynamic E$_h$, E$_v$, v$_h$ and v$_v$ are then calibrated to the static core data. Next, the anisotropic minimum horizontal stress σ$_h$ is calculated from the calibrated elastic moduli by using the equation below:

$$\sigma_h = \frac{E_{h,cal}v_{v,cal}}{E_{v,cal}(1-v_{h,cal})}[\sigma_v - \alpha P_p] + \quad \text{(Equation 12)}$$
$$\alpha P_p + \frac{E_{h,cal}}{1-v_{h,cal}^2}\varepsilon_h + \frac{E_{h,cal}v_{h,cal}}{1-v_{h,cal}^2}\varepsilon_H$$

In the above equation (12), α is Biot's coefficient, P$_p$ is pore pressure, ε$_h$ is minimum tectonic strain, and ε$_H$ is maximum tectonic strain. In the equation above, the two principle strains ε$_h$ and ε$_H$ are unknown and can be derived by fitting the equation (12) with DFIT (Diagnostic Fracture Injection Testing) data.

Step 2 (240)

Referring back to FIG. 2, in the second step (240), the rock mechanical properties and the closure stress from step 1 (238) can be used to generate a rock mechanical model 210 and entered into a 3D fracture simulator 212. Input parameters 214 can also be entered into the 3D fracture simulator. The input parameters 214 can include completion parameters, such as slurry injection rate (q$_{inj}$), total slurry volume (Q$_{tot}$), and the perforation depth (TVD$_{perf}$), and can be varied to generate different induced fracture length (L$_f$), height (H$_f$), width (w$_f$), and effective propped area (EPA).

The 3D fracture simulator 212 and a critical conductivity 216 can be used to generate simulation outputs 218, which can include the effective propped area (EPA) and effective propped length (EPL). The EPA can directly affect the fracture productivity, which is the propped area within the payzone occupied by the fracture conductivity larger than the critical conductivity.

Figure 4:
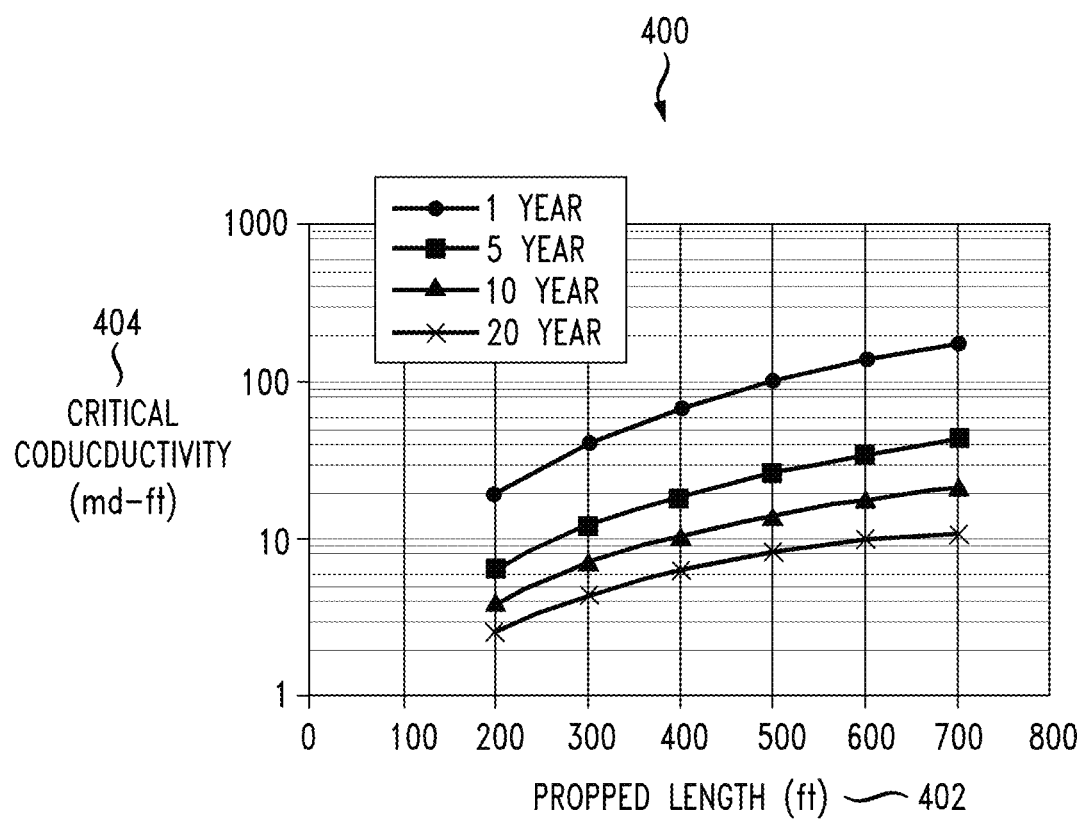
FIG. 4 illustrates an example flowchart of hydraulic fracture characterization from fracture modeling and a neural network.

The critical conductivity 216 can be determined and used to calculate the EPA. The critical conductivity 216 is a function of propped length, production time, matrix permeability, natural fracture properties, oil API and other completion and production parameters. The critical conductivity 216 can refer to the minimum conductivity needed for fully stimulating a certain propped length during a certain production time. Below the critical conductivity, a slight decrease of the conductivity can lead to a large decrease of the production. FIG. 4 illustrates a chart 400 of a critical conductivity 404 as a function of propped length 402 and production time for a 1000 nD shale gas reservoir without natural fractures.

Figure 5:
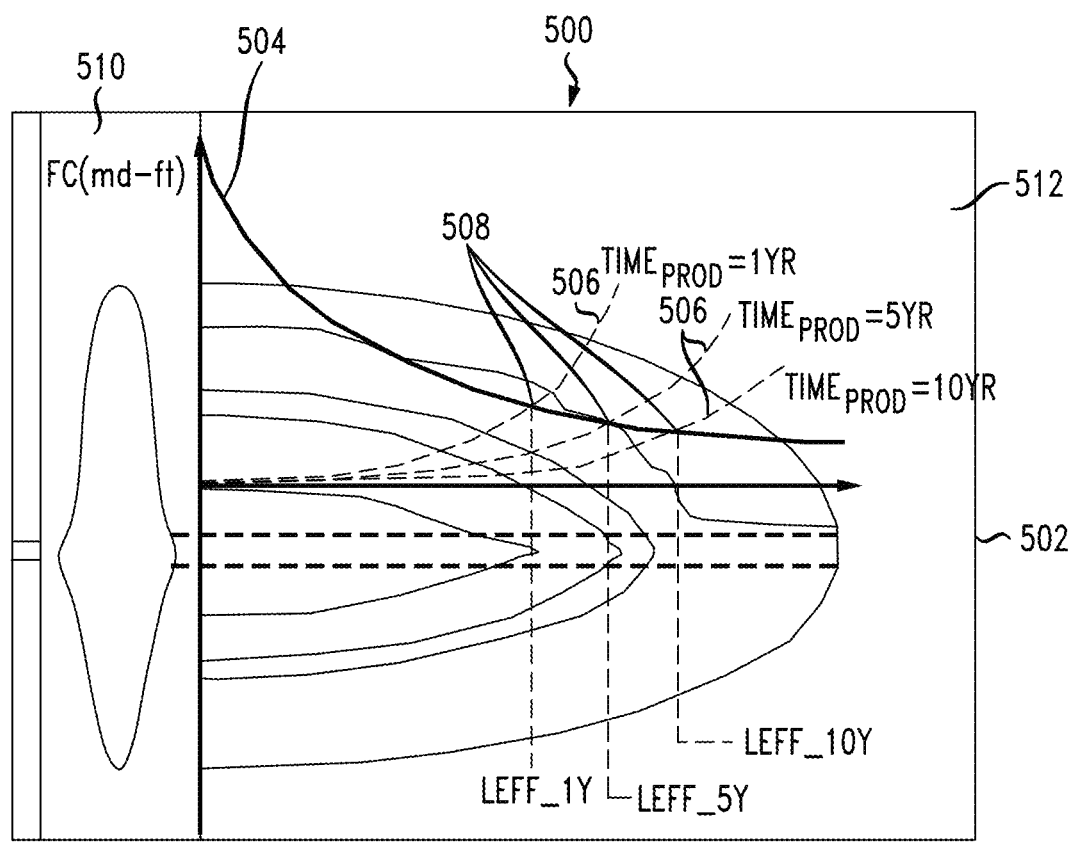
FIG. 5 illustrates example fracture simulation results of fracture geometry and conductivity distribution.

The critical conductivity chart 216 can be applied with the fracture simulation results 212 to decide the EPA for different production periods. FIG. 5 illustrates example fracture simulation results 500. The left track 510 shows the fracture width-height cross section, while the right track 512 shows the length-height cross section. The shading represents the conductivity distribution. The conductivity distribution within the pay zone 502 governs the fracture productivity. In this example, the pay zone 502 is fully propped in the height direction, so the effective propped length (EPL) can be used as an approximation to the EPA. The line 504 shows that the fracture conductivity decreases with increasing propped length. In the same plot, the minimum conductivity required to fully stimulate different propped length is shown by lines 506. The lines 506 are 1-, 5- and 10-year critical conductivity lines based on the critical conductivity chart 400. The cross points 508 between the lines 504 and 506 are effective propped length (EPL) for a different production time.

Referring back to FIG. 2, the fracturing simulator 212 can run numerous times by changing the input values of the fracturing treatment parameters 214 (e.g. $q_{inj}$, $Q_{tol}$, $TVD_{perf}$ and etc.). The simulator 212 can output fracture geometry and conductivity distributions, which can be used to derive the EPA or EPL in the output 218 from step 2 (240).

Step 3 (242)

Referring to step 3 (242) of FIG. 2, the fracture simulator input and output pairs (214, 218) can be used to build the training database 220, and train and validate the neural network (NN) 222. A validation test 224 can then be performed based on the neural network 222. If the validation test fails, the workflow 200 can return, at step 228, to step 2 to obtain additional input and output pairs (214, 218) in order to increase the training database 220. If the validation test 224 results in a pass, neural network coefficients 226 can then be generated.

In the NN, the number of hidden layers, the number of hidden neurons in each layer and the transfer functions in each layer can be selected. Once the NN structure is defined, the system can adjust the NN coefficients 226 in each layer through backpropagation training to minimize the error between output predictions and targets. After the NN is trained and validated from a pilot well, one can input any combination of practical treatment parameter values to get instantaneous predictions of EPA for other wells in the same geological area. FIG. 6 illustrates an example workflow 600 for training a neural network having input layer 606, hidden layers 608, and output layer 610. As shown in this example, input parameters 214 can be input into the 3D fracture simulator 212 to generate output 218.

In some examples, several neural network models can be trained to predict EPA/EPL for different production times. Based on the target production time, the corresponding neural network model can be used in the step 4 (244) of FIG. 2 for ROFI optimization.

Step 4 (244)

Referring to step 4 (244) in FIG. 2, a parametric study 230 can be conducted with a variation of EPA and/or EPL with different treatment parameters 232. A variation of ROFI with different treatment parameters 234 can then be performed and used to generate fracturing design optimization 236, as further explained below.

In this step, the dominant flow regime for initial couple of months observed in fracture shale gas wells can be linear flow. In some cases, the observed linear flow may prevail for several years. The linear flow can be assumed to be a result of transient matrix drainage into the fractures if fracture spacing is not very dense and fracture conductivity is high.

Figure 7:
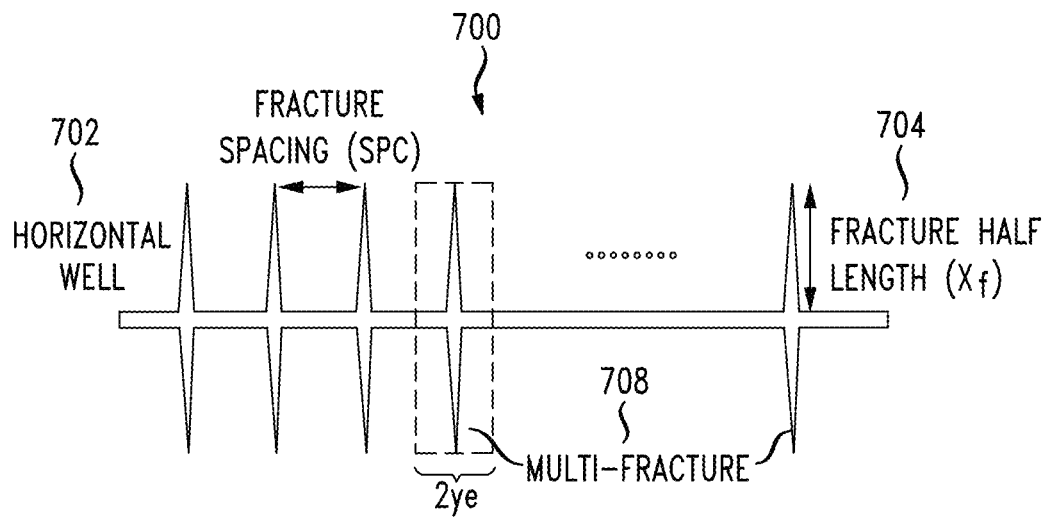
FIG. 7 illustrates a view of a multi-fractured horizontal well in a shale reservoir.

FIG. 7 illustrates an example view 700 in which multiple uniform planar fractures 708 are equally spaced along a horizontal well 702. Assuming the fracture half-length 704 is $x_f$ and the fracture spacing 706 is SPC, the time before the pressure perturbation reaches the boundary ($\pm y_e$) of the rectangular drainage area (dashed side) is defined as the end of linear flow time $t_{elf}$. It is a function of SPC, reservoir porosity ($\varphi$), permeability (k, md), total compressibility ($c_t$, psi$^{-1}$) and reservoir fluid viscosity ($\mu$, cp). The analytical solution of $t_{elf}$ for the line source in a rectangle drainage area is given by equation (13):

$$t_{elf} = \left(\frac{y_e\sqrt{(\varphi\mu c_t)_i}}{0.159\sqrt{k}}\right)^2 \qquad \text{(Equation 13)}$$

The subscript i denotes the initial reservoir pressure condition. Assuming the neighboring fractures have the similar drainage capacity (similar EPA or EPL), $2y_e$ can be replaced by the fracture spacing SPC.

For homogeneous reservoir and single phase fluid flow, the analytical solutions for both constant wellbore pressure and constant wellbore flow rate inner boundary conditions and closed reservoir outer boundary condition are included. The short-term approximation is:

$$\frac{p_i - p_{wf}}{q} = \frac{mB}{hx_f\sqrt{k}}\sqrt{\frac{\mu}{\varphi c_t}}\sqrt{t} + \frac{141.2B\mu s'}{k(2x_f)}, \qquad \text{(Equation 14)}$$

where m is a constant, which is 31.3 for constant wellbore pressure boundary and 19.9 for constant flow rate boundary, q is flow rate in stb/D, t is production time in day, h is the payzone height in ft, $x_f$ is the effective propped length in ft, B is the oil volume factor in RB/STB, $P_i$ is the initial reservoir pressure in psi, $P_{wf}$ is the wellbore flow pressure in psi and s' is the skin factor. The skin effect is primarily due to flow convergence in a horizontal well and the pressure drop within the fracture due to the finite conductivity of the fractures. If replacing $hx_f$ with EPA, the fracture conductivity is large enough that the skin resulting from finite conductivity can be ignored.

Given the geometry of the reservoir considered, linear flow is followed directly by boundary-dominated flow. The flow regime is represented by the long-term approximation to the analytical solution. The solution for the constant wellbore pressure boundary is shown as:

$$\frac{p_i - p_{wf}}{q} = \frac{110.9B\mu}{khn}\exp\left[\frac{0.01562ktn^2}{\varphi c_t\mu x_f^2}\right], \qquad \text{(Equation 15)}$$

where n is ratio of fracture half-length $x_f$ over the drainage boundary $y_e$.

The equations above apply well to the liquid case, but they can be used for gas wells with good accuracy if dimensionless real gas pseudo-pressure is substituted for dimensionless pressure of liquid. The solutions with the inner boundary of constant wellbore pressure are more of interest for long-term production analysis, whereas the solutions with the constant flow rate boundary are more of interest for initial short-term production analysis.

The field production data can be used to improve the production prediction models (14) and (15). In the analytical solutions, B and μ are reservoir fluid properties decided from downhole formation testing. $C_t$ is the total compressibility taking into account the compressibility and saturation of gas, oil, and water as well as the rock compressibility. The total compressibility has only a small effect during transient flow but it has a significant effect during pseudo-steady state (PSS) flow as it directly affects the total energy content of the reservoir. The porosity φ and the permeability k are determined from the core calibrated log interpretations.

For the purpose of prediction, the drainage boundary $y_e$ is assumed to be the half of the fracture spacing SPC/2. It can be calibrated by substituting the end of linear flow time observed from the filed data into equation (13). The effective propped fracture height h and half-length $x_f$ are modeled from the neural network trained in the step 3. If there is a nearby single fracture with production logs showing both transient flow regime and boundary dominant flow regime, the analytical solutions (14) and (15) can be used to fit the data to determine h and $x_f$. The fitting h and $x_f$ can be used to determine the fracture modeling bias, which can be used to correct the neural network predictions for other wells.

By using the analytical solutions (14) and (15), the EPA or EPL results generated from trained neural network can be converted to the cumulative production (Q, stb). Eq. (16) is the cumulative production within $t_1$ days ($t_1 <= t_{elf}$) as a function of EPA assuming zero skin, $$Q = \sum_0^{t_1} q_{lf} = \sum_0^{t_1} \frac{(p_i - p_{wf})EPA\sqrt{\varphi c_t k}}{mB\sqrt{\mu t}}. \quad \text{(Equation 16)}$$

When the fracture starts interfere with the neighboring fractures ($t_2 > t_{elf}$), the flow regime goes from the transient flow regime to the boundary flow regime. If the fracture EPA and spacing do not change along the horizontal well, the cumulative production within $t_2$ days is, $$Q = \sum_0^{t_{elf}} q_{lf} + \sum_{t_{elf}}^{t_2} q_{bdf} = \sum_0^{t_{elf}} \frac{(p_i - p_{wf})EPA\sqrt{\varphi c_t k}}{mB\sqrt{\mu t}} + \sum_{t_{elf}}^{t_2} \frac{(p_i - p_{wf})kEPA}{110.9B\mu y_e \exp\left[\frac{0.01562kt}{\varphi c_t \mu y_e^2}\right]}. \quad \text{(Equation 17)}$$

Figure 8:
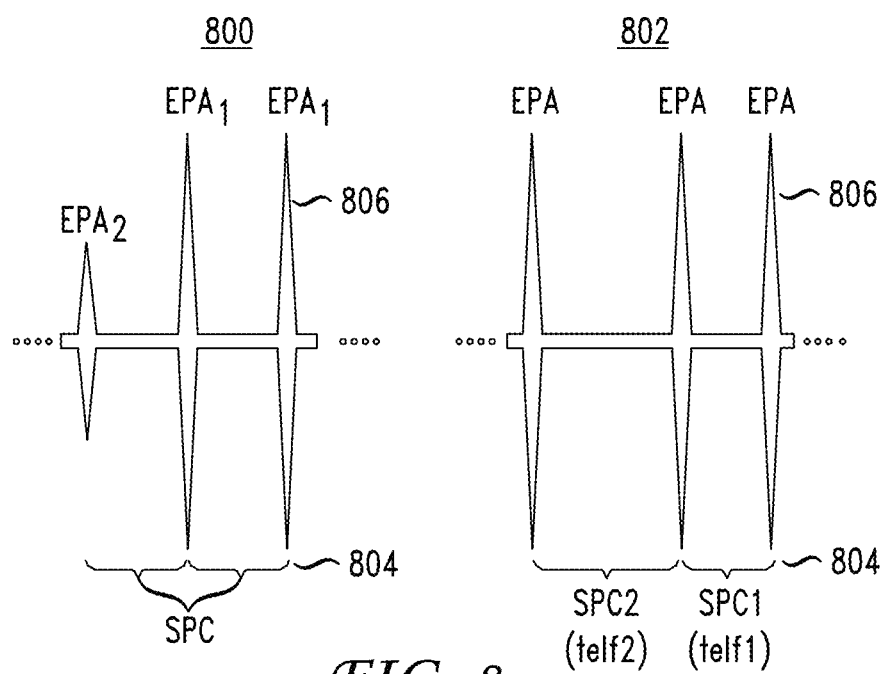
FIG. 8A illustrates an example scenario where the fracture effective propped area is different for neighboring fractures.
FIG. 8B illustrates an example scenario where the fracture spacing is not uniform.

The equation (17) is not established for two scenarios: the fracture EPA is different for neighboring fractures, the fracture spacing is not uniform. FIG. 8 illustrates examples of scenario 800 when the fracture EPA is different for neighboring fractures, and scenario 802 when the fracture spacing is not uniform. For scenario 800, the simplest case is that one of the neighboring fractures 806 has a smaller EPA and all the other fractures 806 have the same EPA. For scenario 802, the fracture spacing 804 at one side is different from the spacing at the other side and the production time is longer than $t_{elf1}$ but shorter than $t_{elf2}$.

For scenario 800, the equation (17) can be modified as:

$$Q = \sum_0^{t_{elf}} \frac{(p_i - p_{wf})EPA_1\sqrt{\varphi c_t k}}{mB\sqrt{\mu t}} + \sum_{t_{elf}}^{t_2} \frac{(p_i - p_{wf})k0.5(EPA_2 + EPA_1)}{110.9B\mu y_e \exp\left[\frac{0.01562kt}{\varphi c_t \mu y_e^2}\right]} + \frac{1}{2}\sum_{t_{elf}}^{t_2} \frac{(p_i - p_{wf})(EPA_1 - EPA_2)\sqrt{\varphi c_t k}}{mB\sqrt{\mu t}}. \quad \text{(Equation 18)}$$

For scenario 802, the equation (17) can be modified as ($t_{elf1} < t_2 < t_{elf2}$), $$Q = \sum_0^{t_{elf1}} \frac{(p_i - p_{wf})EPA\sqrt{\varphi c_t k}}{mB\sqrt{\mu t}} + \frac{1}{2}\sum_{t_{elf1}}^{t_2} \frac{(p_i - p_{wf})kEPA}{110.9B\mu y_e \exp\left[\frac{0.01562kt}{\varphi c_t \mu y_e^2}\right]} + \frac{1}{2}\sum_{t_{elf1}}^{t_2} \frac{(p_i - p_{wf})EPA\sqrt{\varphi c_t k}}{mB\sqrt{\mu t}}. \quad \text{(Equation 19)}$$

The two equations (18) and (19) can be further modified for more complex scenarios based on the similar linear superposition theory.

The Return-On-Fracturing-Investment (ROFI) is estimated by simply subtracting the fracturing treatment cost from the cumulative production values, ROFI=$Q$*Oil Price−(Proppant Cost+NonProppant Cost). (Equation 20)

where non-proppant cost is the bundled cost related to proppant-laden fluid, pumping equipment and services. For typical slickwater treatment, the bundled cost can be roughly estimated as $2.5/gal of water injected*total water volume.

If natural fractures are observed in the target shale formations, the reservoir permeability becomes anisotropic ($k_x \neq k_y$). The permeability along the natural fracture direction is larger than the permeability orthogonal to the natural fracture set. The natural fracture density can be determined from the observation of the outcrop or image logs, whereas the natural fracture conductivity can be determined from the core flooding test. By inputting the natural fracture density and conductivity in the reservoir simulator, the permeability at two principle directions ($k_x$ and $k_y$) can be predicted. In some cases, the permeability anisotropy effect can be taken into account.

In equations (15) and (16), the dimensions in the x direction are changed to:

$$x_f' = x_f(k_y/k_x)^{0.5},$$

while dimensions in they direction are changed to:

$$y_f'=y_f(k_x/k_y)^{0.5}.$$

The permeability is changed to the product of the square root of the directional permeability $(k_y*k_x)^{0.5}$.

Figure 9:
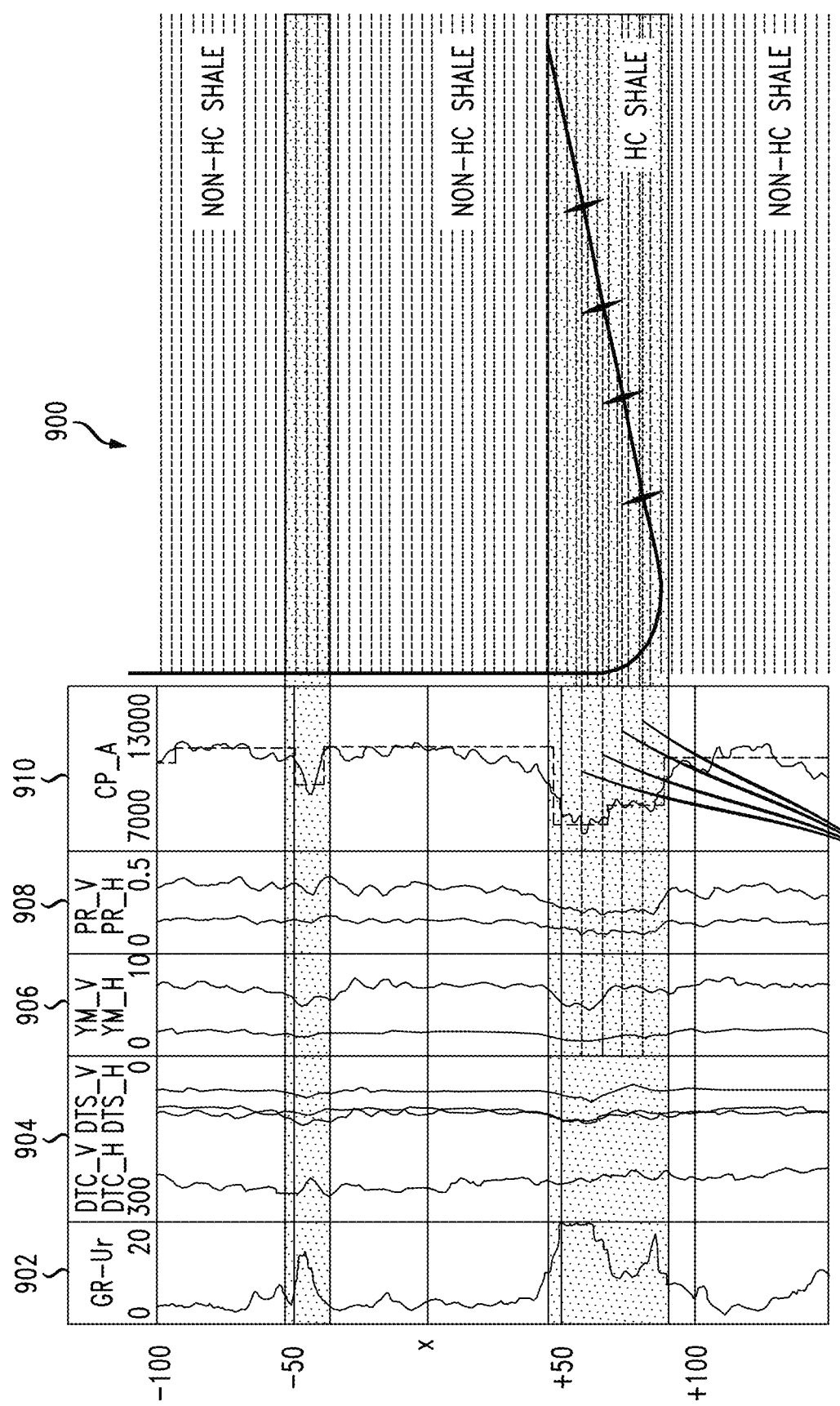
FIG. 9 illustrates example well log results.

Referring to FIG. 9, well log results for a target well are illustrated to demonstrate the applicability of the ROFI optimization workflow. FIG. 9 is an interpreted log for a shale reservoir. From left to right, the tracks 902-910 show uranium concentration 902, sonic wave slowness 904, Young's Modulus 906, Poisson's Ratio 908 and closure stress 910. Based on the facts of vertical DTS≠horizontal DTS and DTS_fast=DTS_slow from track 904, the shale can be approximated as a VTI medium. The horizontal and vertical elastic moduli are interpreted by using one of the anisotropic acoustic models introduced in step 1 from FIG. 2, and the results are shown in tracks 906 and 908.

Based on the elastic moduli, equation (12) can be used to calculate the closure stress, which is shown in the last track 910. According to the closure stress results and TOC results from a geochem log (not shown), it is a five-bedding-layer case with an upper pay, a lower pay and three stress boundary layers. The horizontal well can be drilled through the lower pay with toe-up as the solid line shows. As the dashed lines 912 illustrate, each perforation location along the horizontal well can be related back to the TVD based on the borehole inclination and azimuth (e.g., geosteering data). The current log interpretation results were already calibrated to the static core data.

The log-derived rock mechanical properties are input in a 3D fracture simulator for multi case running. Some fracture simulators may assume isotropic rock models, and may only accept a single value of Young's modulus and Poisson's ratio. A methodology can be employed to convert the four anisotropic elastic properties to two equivalent isotropic properties to account for the rock anisotropy behavior in such isotropic fracture simulators.

In this study (e.g., study 230 shown in FIG. 2), three fracturing treatment parameters are chosen to be optimized, including slurry injection rate, total pumping volume, and perforation location ($TVD_{perf}$). By varying the values of the input parameters, the simulator generates different values of effective propped length. The $l_{eff}$ results from the fracture simulator and their corresponding input treatment parameters are then delivered to a MATLAB neural network toolbox for neural network training.

Figure 10:
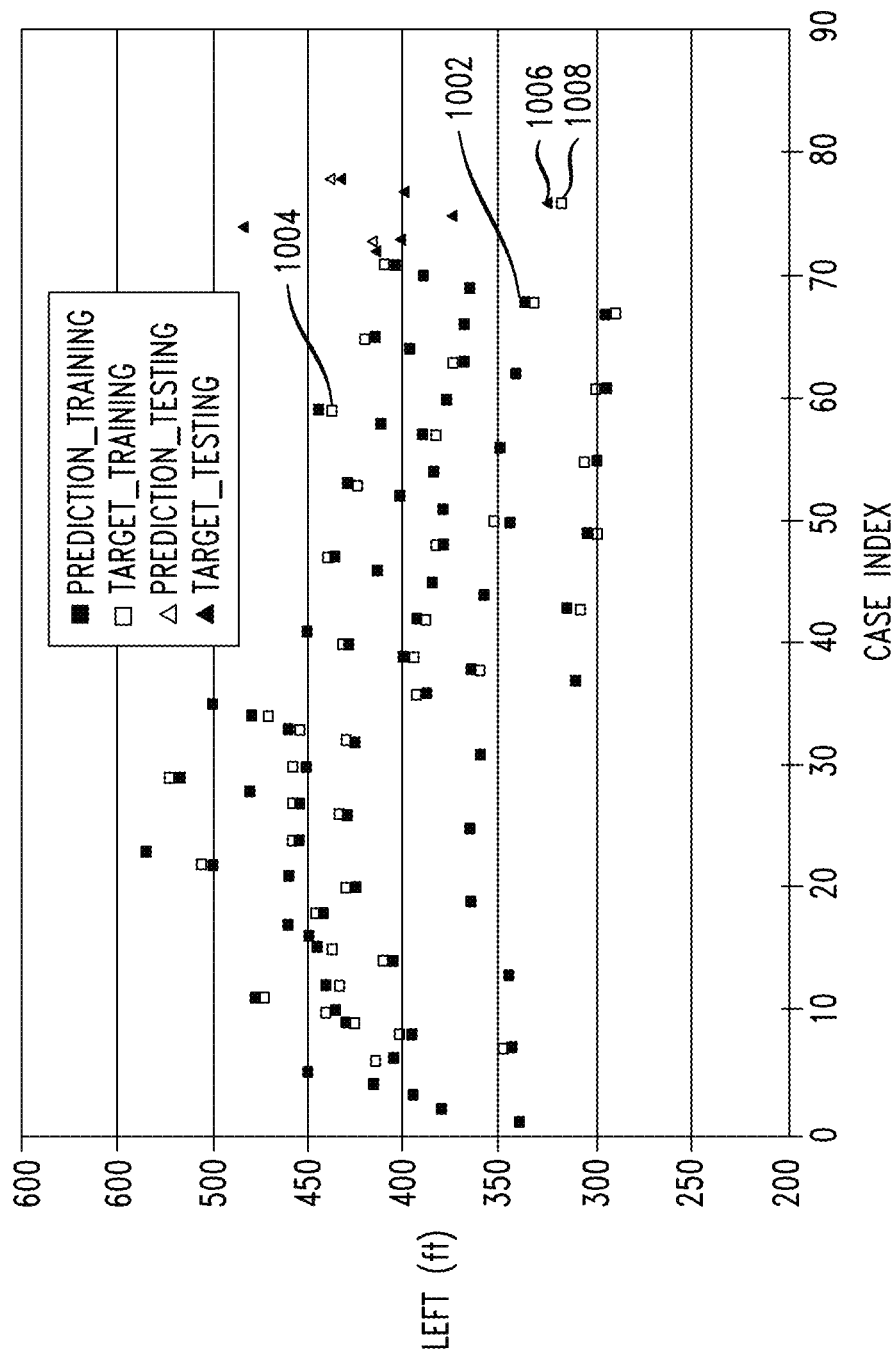
FIG. 10 illustrates an example comparison chart of target and predicted values.

The neural network can have two hidden layers with TANSIG as the transfer function. An effective neural network can be obtained from a 70 training cases database, for example. FIG. 10 illustrates an example chart 1000 of values 1002-1008, including target values 1002, 1006 of $L_{eff}$ and values predicted 1004, 1008 by the neural network. The values 1002, 1004 are 70 training data points, while the values 1006, 1008 are seven random testing cases.

Once the neural network model is trained and validated from a pilot or master well, it can be applied to other wells in the same geological area to predict the effective propped length at any combinations of treatment parameter values instantaneously. The fast prediction feature makes the neural network model very useful and efficient for massive parametric study, and hence, fracturing design optimization.

Figure 11A:
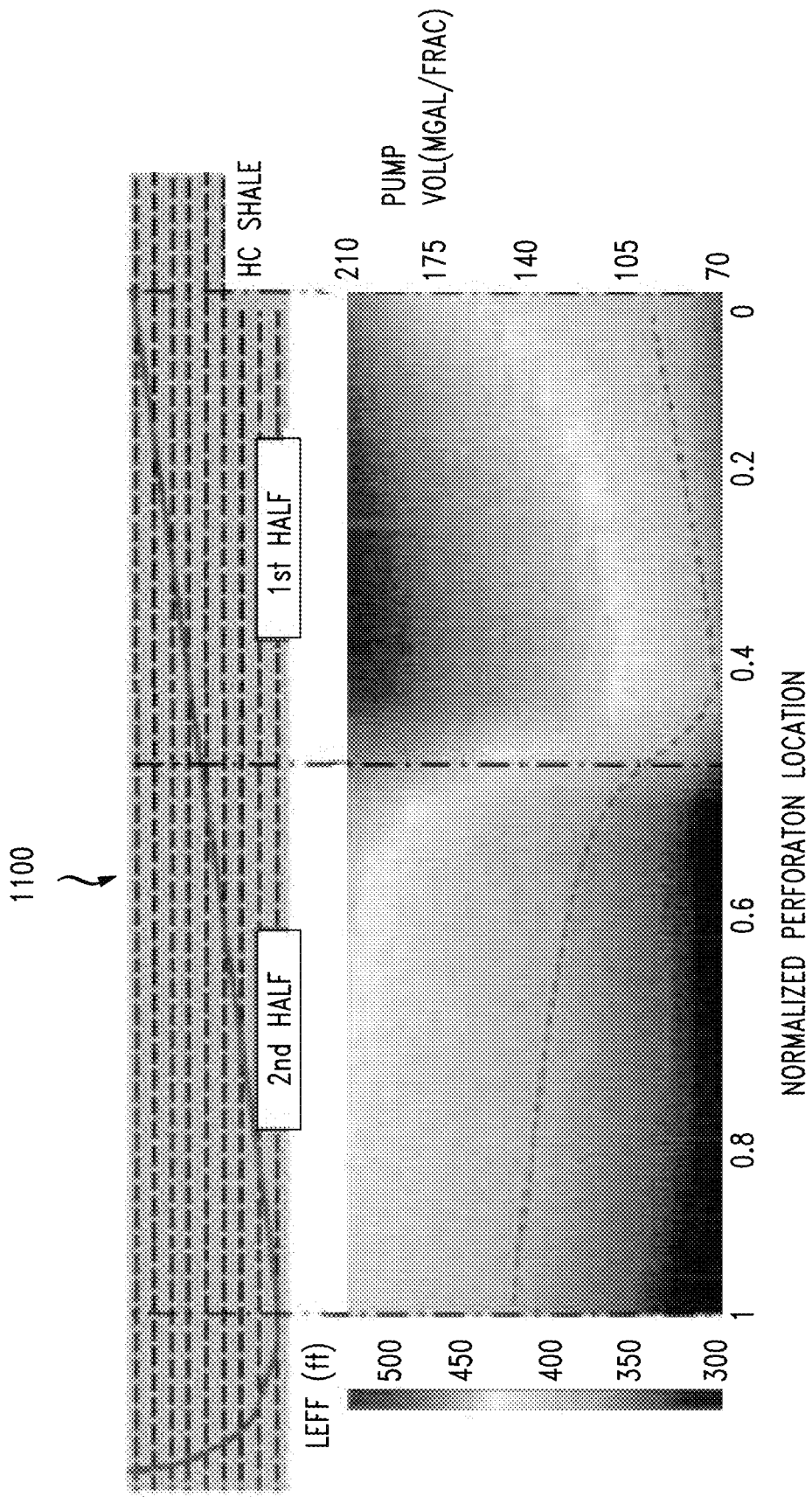
FIG. 11 illustrates an example map of a 1-year effective propped length for varied injection volume and perforation location.

FIG. 11 illustrates an example map depicting how the 1-year effective propped length varies with perforation position and injection volume at a given injection rate of 40 bbl/min per stage. According to the results, propped length increases with increasing pumping volume for a certain propped location. More slurry should be pumped for the second half of the horizontal well to achieve the similar effective propped length as the first half of the well.

Figure 11B:
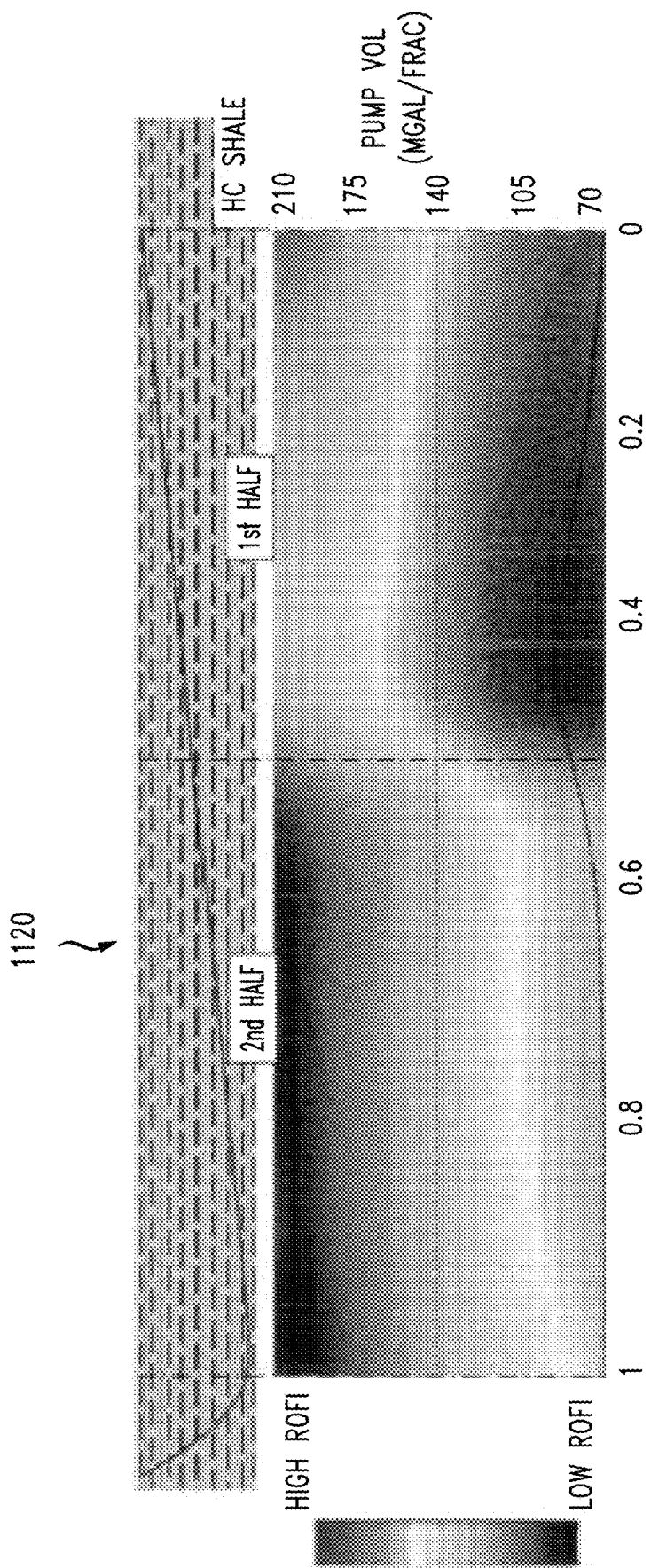

The 1-year effective propped length map (FIG. 11) can be converted to the 1-year ROFI map shown in FIG. 11B by using equations (16)-(19). The basic reservoir petrophysical properties and the completion information are listed in the table below. In this example, the target is to maximize the 1-year ROFI. The total fracture number is fixed. The fracture spacing and the pumping parameters like injection volume are to be optimized.

TABLE 2

Reservoir properties and completion parameters for the field case

| Parameters | Parameter Value |
|---|---|
| Pay Thickness (ft) | 50 |
| Porosity (%) | 10% |
| Absolute Permeability (md) | 0.015 |
| Initial Reservoir Pressure (psia) | 6100 |
| Initial Oil Saturation (%) | 80 |
| Initial Oil FVF (RB/STB) | 1.5 |
| Initial Oil Viscosity (cp) | 2.2 |
| Total Compressibility ($psi^{-1}$) | 1.9e−5 |
| Horizontal Well Length (ft) | 6500 |
| Planed Hydraulic Fracture Number | 16 |
| Bottomhole Flowing Pressure (psi) | 1000 |

Figure 12:
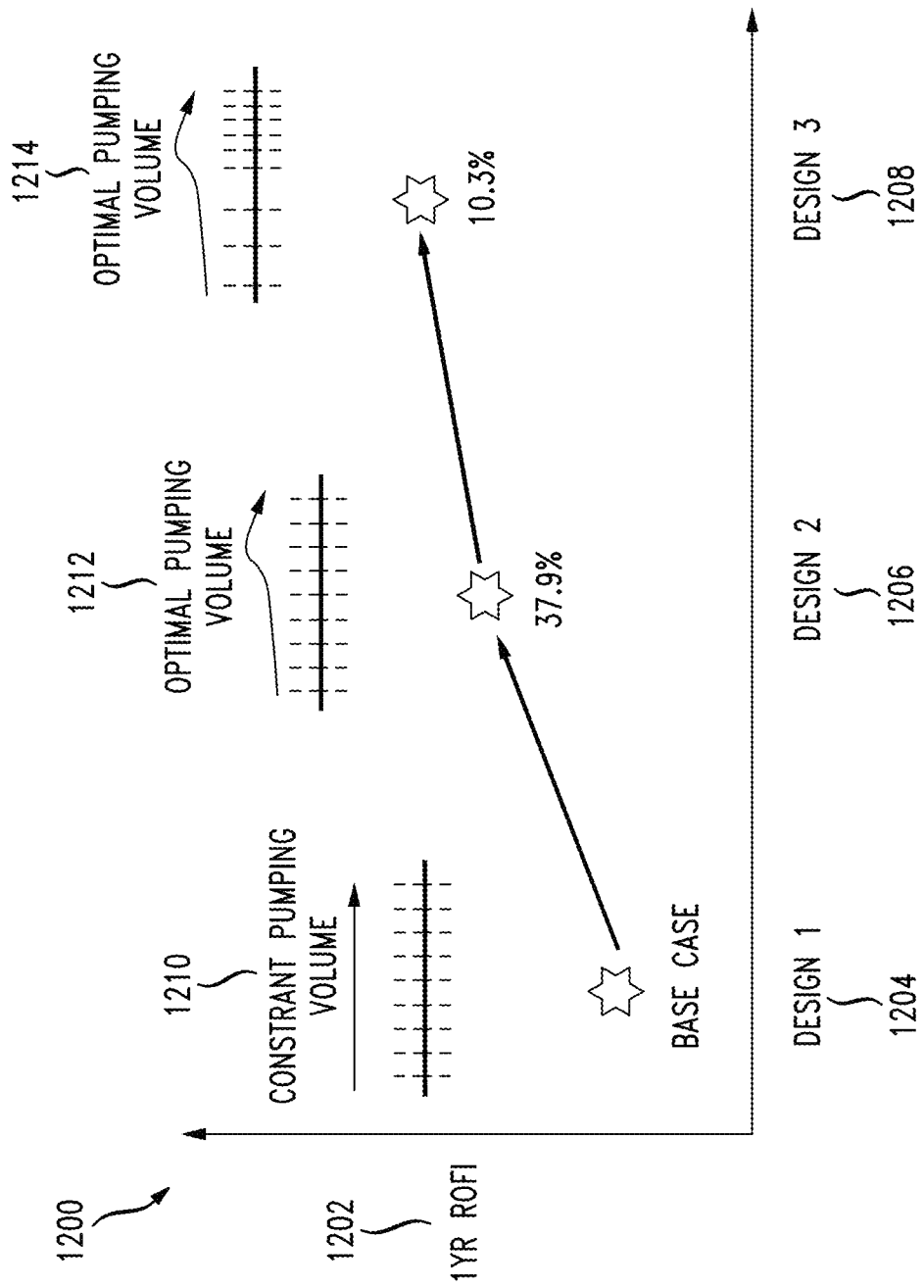
FIG. 12 illustrates an example map of a 1-year return-of-fracturing-investment for varied injection volume and perforation location.

FIG. 12 illustrates 1-year ROFI optimization 1200 based on the ROFI map generated from the neural network model. The optimization 1200 can be associated with the example fracturing designs 1204-1208 described below. These fracturing designs are non-limiting, and elements of these designs can be combined as required by those using these principles.

Fracturing Design 1

The base case is the geometric staging design without any optimization of the treatment parameters. Assuming each stage can generate one main hydraulic fracture, the fracture spacing is a constant along the lateral. The spacing is 6000 ft/15=400 ft. The same amount of fluid is injected in each stage with a constant pumping volume 1210 of 140 Mgal/Frac. The ROFI of Design 1 (1204) is shown in the FIG. 12.

Fracturing Design 2

The second design is still the geometric staging design with constant fracture spacing along the lateral. The amount of fluid injected in each stage follows the optimum pumping 1212. The ROFI of Design 2 (1206) is shown in FIG. 12. An increase of 37.9% is observed by optimizing the pumping volume at different stages based on the ROFI map 1100.

Fracturing Design 3

In the third design, more stages are put in the 1st half of the lateral because of the observed higher ROFI in the upper part of the payzone. The fracture number in the 'sweet zone' is increased until telf=1 year. The rest of the stages are equally placed in the second half of the lateral or the lower portion of the payzone. The amount of fluid injected in each stage still follows the optimum pumping 1212. By doing that, the ROFI is further increased by 10.3%.

This example shows that the reservoir specified neural network model can be easily used to guide perforating and pumping design to maximize returns. By considering the staging and perforation cost, the workflow can be extended to optimize the stage number and perforation cluster number. The new workflow can be combined with other workflows to provide the operator a more comprehensive understanding of how to optimize the design of completion stages, perforations and pumping strategy.

Figure 13:
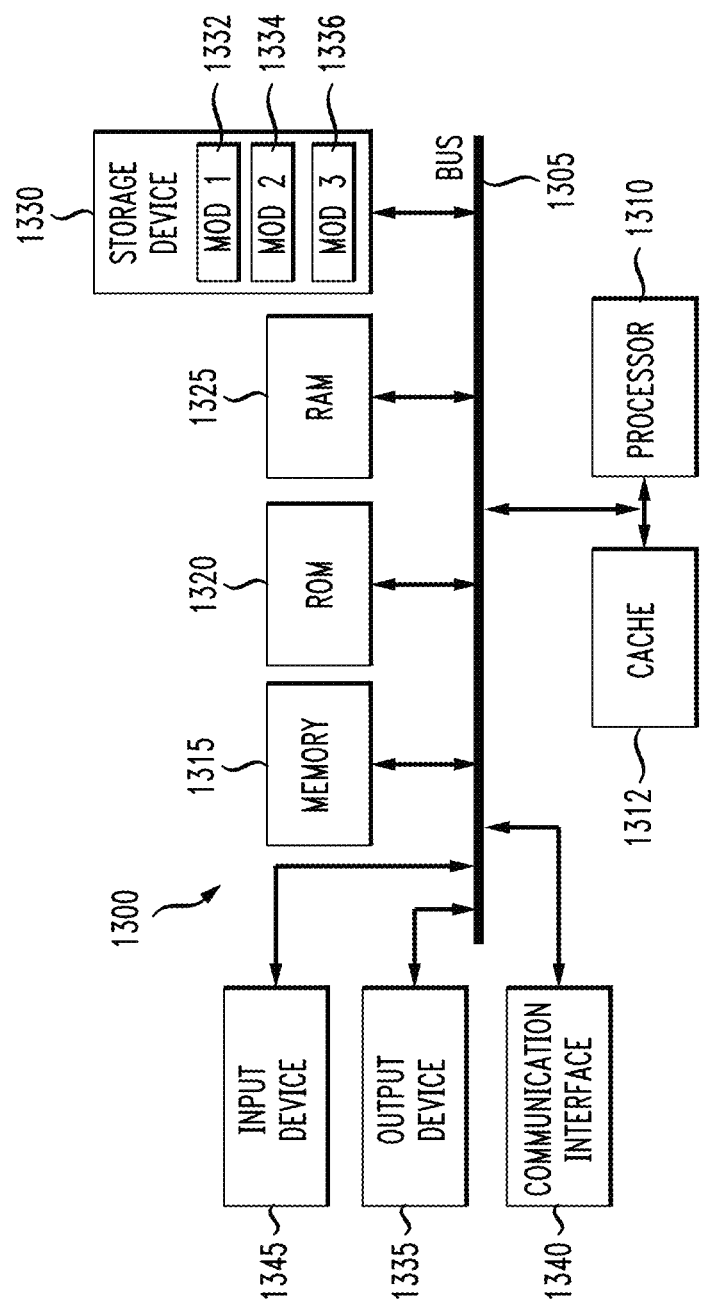
FIG. 13 illustrates an example system embodiment.

FIG. 13 illustrates example computing device which can be employed to perform various steps, methods, and techniques disclosed above. The more appropriate embodiment will be apparent to those of ordinary skill in the art when practicing the present technology. Persons of ordinary skill in the art will also readily appreciate that other system embodiments are possible.

Example system and/or computing device 1300 includes a processing unit (CPU or processor) 1310 and a system bus 1305 that couples various system components including the system memory 1315 such as read only memory (ROM) 1320 and random access memory (RAM) 1335 to the processor 1310. The processors of FIG. 1 (i.e., the downhole processor 44, the local processor 113, and the remote processor 12, can all be forms of this processor 1310. The system 1300 can include a cache 1312 of high-speed memory connected directly with, in close proximity to, or integrated as part of the processor 1310. The system 1300 copies data from the memory 1315 and/or the storage device 1330 to the cache 1312 for quick access by the processor 1310. In this way, the cache provides a performance boost that avoids processor 1310 delays while waiting for data. These and other modules can control or be configured to control the processor 1310 to perform various operations or actions. Other system memory 1315 may be available for use as well. The memory 1315 can include multiple different types of memory with different performance characteristics.

It can be appreciated that the disclosure may operate on a computing device 1300 with more than one processor 1310 or on a group or cluster of computing devices networked together to provide greater processing capability. The processor 1310 can include any general purpose processor and a hardware module or software module, such as module 1 1332, module 2 1334, and module 3 1336 stored in storage device 1330, configured to control the processor 1310 as well as a special-purpose processor where software instructions are incorporated into the processor. The processor 1310 may be a self-contained computing system, containing multiple cores or processors, a bus, memory controller, cache, etc. A multi-core processor may be symmetric or asymmetric. The processor 1310 can include multiple processors, such as a system having multiple, physically separate processors in different sockets, or a system having multiple processor cores on a single physical chip. Similarly, the processor 1310 can include multiple distributed processors located in multiple separate computing devices, but working together such as via a communications network. Multiple processors or processor cores can share resources such as memory 1315 or the cache 1312, or can operate using independent resources. The processor 1310 can include one or more of a state machine, an application specific integrated circuit (ASIC), or a programmable gate array (PGA) including a field PGA.

The system bus 1305 may be any of several types of bus structures including a memory bus or memory controller, a peripheral bus, and a local bus using any of a variety of bus architectures. A basic input/output (BIOS) stored in ROM 1320 or the like, may provide the basic routine that helps to transfer information between elements within the computing device 1300, such as during start-up. The computing device 1300 further includes storage devices 1330 or computer-readable storage media such as a hard disk drive, a magnetic disk drive, an optical disk drive, tape drive, solid-state drive, RAM drive, removable storage devices, a redundant array of inexpensive disks (RAID), hybrid storage device, or the like. The storage device 1330 can include software modules 1332, 1334, 1336 for controlling the processor 1310. The system 1300 can include other hardware or software modules. The storage device 1330 is connected to the system bus 1305 by a drive interface. The drives and the associated computer-readable storage devices provide nonvolatile storage of computer-readable instructions, data structures, program modules and other data for the computing device 1300. In one aspect, a hardware module that performs a particular function includes the software component stored in a tangible computer-readable storage device in connection with the necessary hardware components, such as the processor 1310, bus 1305, display 170, and so forth, to carry out a particular function. In another aspect, the system can use a processor and computer-readable storage device to store instructions which, when executed by the processor, cause the processor to perform operations, a method or other specific actions. The basic components and appropriate variations can be modified depending on the type of device, such as whether the device 1300 is a small, handheld computing device, a desktop computer, or a computer server. When the processor 1310 executes instructions to perform "operations", the processor 1310 can perform the operations directly and/or facilitate, direct, or cooperate with another device or component to perform the operations.

Although the exemplary embodiment(s) described herein employs the hard disk 1330, other types of computer-readable storage devices which can store data that are accessible by a computer, such as magnetic cassettes, flash memory cards, digital versatile disks (DVDs), cartridges, random access memories (RAMs) 1335, read only memory (ROM) 1320, a cable containing a bit stream and the like, may also be used in the exemplary operating environment. Tangible computer-readable storage media, computer-readable storage devices, or computer-readable memory devices, expressly exclude media such as transitory waves, energy, carrier signals, electromagnetic waves, and signals per se.

To enable user interaction with the computing device 1300, an input device 190 represents any number of input mechanisms, such as a microphone for speech, a touch-sensitive screen for gesture or graphical input, keyboard, mouse, motion input, speech and so forth. An output device 1335 can also be one or more of a number of output mechanisms known to those of skill in the art. In some instances, multimodal systems enable a user to provide multiple types of input to communicate with the computing device 1300. The communications interface 1340 generally governs and manages the user input and system output. There is no restriction on operating on any particular hardware arrangement and therefore the basic hardware depicted may easily be substituted for improved hardware or firmware arrangements as they are developed.

For clarity of explanation, the illustrative system embodiment is presented as including individual functional blocks including functional blocks labeled as a "processor" or processor 1310. The functions these blocks represent may be provided through the use of either shared or dedicated hardware, including, but not limited to, hardware capable of executing software and hardware, such as a processor 1310, that is purpose-built to operate as an equivalent to software executing on a general purpose processor. For example the functions of one or more processors presented in FIG. 13 may be provided by a single shared processor or multiple processors. (Use of the term "processor" should not be construed to refer exclusively to hardware capable of executing software.) Illustrative embodiments may include microprocessor and/or digital signal processor (DSP) hardware, read-only memory (ROM) 1320 for storing software performing the operations described below, and random access memory (RAM) 1335 for storing results. Very large scale integration (VLSI) hardware embodiments, as well as custom VLSI circuitry in combination with a general purpose DSP circuit, may also be provided.

The logical operations of the various embodiments are implemented as: (1) a sequence of computer implemented steps, operations, or procedures running on a programmable circuit within a general use computer, (2) a sequence of computer implemented steps, operations, or procedures running on a specific-use programmable circuit; and/or (3) interconnected machine modules or program engines within the programmable circuits. The system 1300 shown in FIG. 13 can practice all or part of the recited methods, can be a part of the recited systems, and/or can operate according to instructions in the recited tangible computer-readable storage devices. Such logical operations can be implemented as modules configured to control the processor 1310 to perform particular functions according to the programming of the module. For example, FIG. 13 illustrates three modules Mod1 1332, Mod2 1334 and Mod3 1336 which are modules configured to control the processor 1310. These modules may be stored on the storage device 1330 and loaded into RAM 1335 or memory 1315 at runtime or may be stored in other computer-readable memory locations.

One or more parts of the example computing device 1300, up to and including the entire computing device 1300, can be virtualized. For example, a virtual processor can be a software object that executes according to a particular instruction set, even when a physical processor of the same type as the virtual processor is unavailable. A virtualization layer or a virtual "host" can enable virtualized components of one or more different computing devices or device types by translating virtualized operations to actual operations. Ultimately however, virtualized hardware of every type is implemented or executed by some underlying physical hardware. Thus, a virtualization compute layer can operate on top of a physical compute layer. The virtualization compute layer can include one or more of a virtual machine, an overlay network, a hypervisor, virtual switching, and any other virtualization application.

The processor 1310 can include all types of processors disclosed herein, including a virtual processor. However, when referring to a virtual processor, the processor 1310 includes the software components associated with executing the virtual processor in a virtualization layer and underlying hardware necessary to execute the virtualization layer. The system 1300 can include a physical or virtual processor 1310 that receive instructions stored in a computer-readable storage device, which cause the processor 1310 to perform certain operations. When referring to a virtual processor 1310, the system also includes the underlying physical hardware executing the virtual processor 1310.

Embodiments within the scope of the present disclosure may also include tangible and/or non-transitory computer-readable storage devices for carrying or having computer-executable instructions or data structures stored thereon. Such tangible computer-readable storage devices can be any available device that can be accessed by a general purpose or special purpose computer, including the functional design of any special purpose processor as described above. By way of example, and not limitation, such tangible computer-readable devices can include RAM, ROM, EEPROM, CD-ROM or other optical disk storage, magnetic disk storage or other magnetic storage devices, or any other device which can be used to carry or store desired program code in the form of computer-executable instructions, data structures, or processor chip design. When information or instructions are provided via a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

Figure 14:
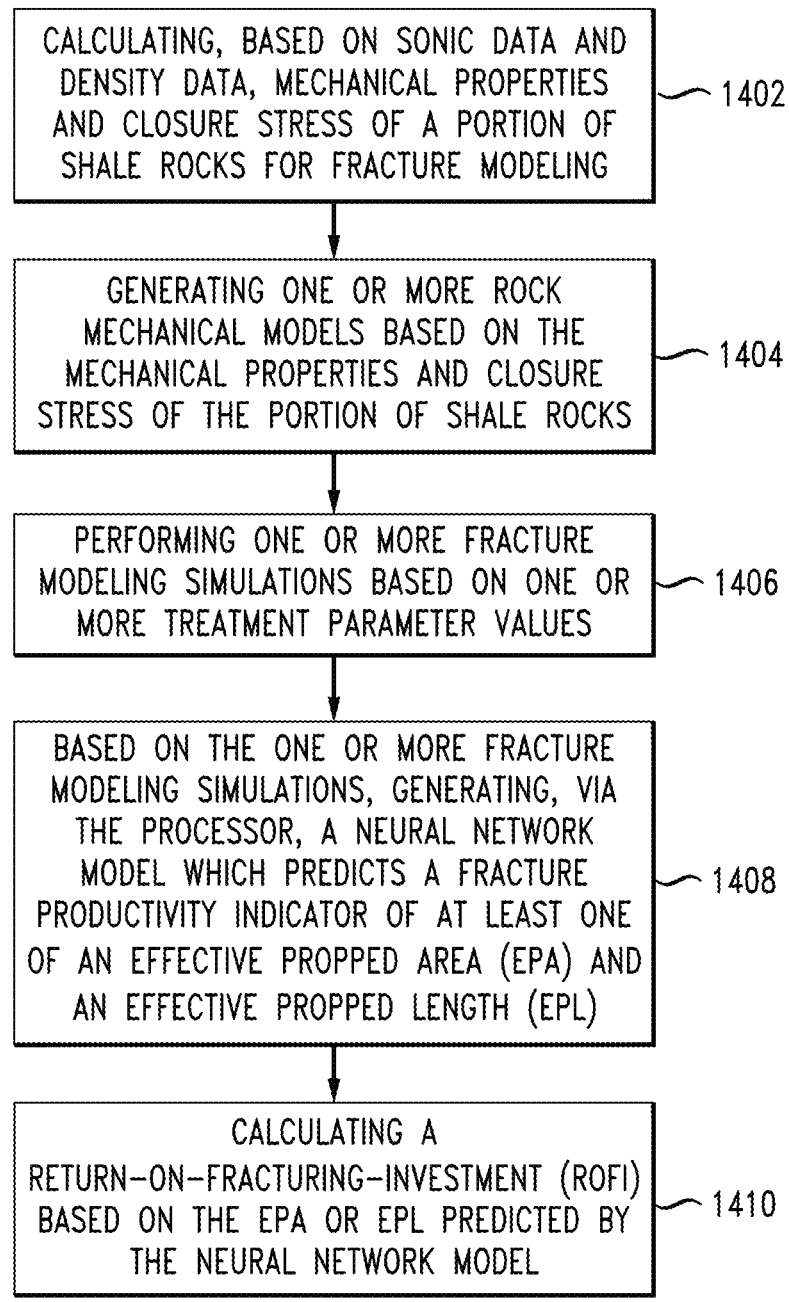
FIG. 14 illustrates an example method embodiment.

Having disclosed some basic system components and concepts, the disclosure now turns to the example method embodiment shown in FIG. 14. For the sake of clarity, the method is described in terms of system 1300, as shown in FIG. 13, configured to perform various steps and operations in the method. The steps outlined herein are exemplary and can be implemented in any combination thereof, including combinations that exclude, add, or modify certain steps.

At step 1400, the system 1300 can calculate, based on sonic data and density data, mechanical properties and closure stress of a portion of shale rocks for fracture modeling. The portion of shale rocks can be associated with a well, such as well 48. The mechanical properties can include, for example, Young's modulus, Poisson's ration stiffness coefficients, etc. The system 1300 can interpret the stiffness tensor of the shale rocks based on an isotropic acoustic model, a Stoneley anisotropic acoustic model, a non-Stoneley model, etc., as well as log data (e.g., sonic, density, etc.) and/or rock type data (e.g., isotropic, VTI, HTI, deviated, etc.). The system 1300 can interpret stiffness coefficients and shale anisotropy from the sonic data.

At step 1402, the system 1300 can generate one or more rock mechanical models based on the mechanical properties and closure stress of the portion of shale rocks. In some cases the one or more rock mechanical models can be based on varying treatment values.

At step 1404, the system 1300 can perform one or more fracture modeling simulations based on one or more treatment parameter values, such as slurry injection rate, a total slurry volume, a perforation depth, etc. The one or more fracture modeling simulations can be based on a horizontal and vertical Young's modulus and Poisson's ratio, and the fracture closure stress. The fracture closure stress is based on a stress equation having strains ch and cH as empirical parameters decided by fitting log derived stress results with DFIT (Diagnostic Fracture Injection Testing) data.

Based on the one or more fracture modeling simulations, at step 1406, the system can generate a neural network model which predicts a fracture productivity indicator of an effective propped area (EPA) and/or an effective propped length (EPL).

At step 1406, the system 1300 can calculate a return-on-fracturing-investment (ROFI) based on the EPA or EPL predicted by the neural network model. The system 1300 can use the ROFI to generate a parametric study for one or more wells in a same geological area in near real-time.

The fracture productivity indicator EPA can be calculated from the neural network model at different input fracturing treatment parameters. The EPA can be a propped payzone area within which the conductivity is no less than the critical conductivity, and a critical conductivity is a minimum conductivity beyond which a fracture behaves like infinite conductive. The critical conductivity can increase with an increasing reservoir permeability, increasing propped length and/or decreasing production time.

The neural network predicted EPA to ROFI can be based on a linear transient flow theory or boundary dominant flow theory. The linear transient theory or the boundary dominant flow theory can be based on an assumption of a single phase fluid, a homogeneous reservoir, and no time effect on petrophysical properties and fluid properties associated with the portion of shale rocks.

The natural fracture effect can be accounted for linear transient theory or the boundary dominant flow theory.

The various embodiments described above are provided by way of illustration only and should not be construed to limit the scope of the disclosure. For example, the principles herein apply equally to optimization as well as general improvements. Various modifications and changes may be made to the principles described herein without following the example embodiments and applications illustrated and described herein, and without departing from the spirit and scope of the disclosure. Claim language reciting "at least one of" a set indicates that one member of the set or multiple members of the set satisfy the claim.

Statements of the Disclosure Include:

Statement 1: A method comprising: calculating, based on sonic data and density data, mechanical properties and closure stress of a portion of shale rocks for fracture modeling; generating, via a processor, one or more rock mechanical models based on the mechanical properties and closure stress of the portion of shale rocks; performing, via the processor, one or more fracture modeling simulations based on one or more treatment parameter values; based on the one or more fracture modeling simulations, generating, via the processor, a neural network model which predicts a fracture productivity indicator of at least one of an effective propped area (EPA) and an effective propped length (EPL); and calculating a return-on-fracturing-investment (ROFI) based on the EPA or EPL predicted by the neural network model.

sending, via a first device, an electrical signal down an electric line that runs down an outside of a downhole casing of a wellbore; detecting, via a downhole sensor system located at a downhole location inside the downhole casing, a magnetic field generated by a current of the electrical signal; identifying one or more characteristics associated with the magnetic field, the one or more characteristics including at least one of a magnetic field parameter, a frequency pattern, and a current pattern; based on the one or more characteristics associated with the magnetic field, determining a first position of the electric line relative to at least one of the downhole casing and the downhole sensor system; and inferring, based on the first position of the electric line, a second position of a non-electroconductive cable that runs alongside the electric line outside of the downhole casing of the wellbore.

Statement 2: The method according to Statement 1, further comprising interpreting a stiffness tensor associated with the portion of shale rocks based on the at least one of the isotropic acoustic model, the Stoneley anisotropic acoustic model, and the non-Stoneley model.

Statement 3: The method according to Statement 1 or Statement 2, further comprising interpreting a stiffness tensor associated with the portion of shale rocks based on the at least one of the isotropic acoustic model, the Stoneley anisotropic acoustic model, and the non-Stoneley model.

Statement 4: The method according to any one of Statements 1 to 3, further comprising interpreting stiffness coefficients and shale anisotropy from the sonic data.

Statement 5: The method according to any one of Statements 1 to 4, further comprising calculating a horizontal and vertical Young's modulus and Poisson's ratio and the fracture closure stress, the one or more fracture modeling simulations being based on the horizontal and vertical Young's modulus and Poisson's ratio.

Statement 6: The method according to any one of Statements 1 to 5, wherein the fracture closure stress is based on a stress equation having strains $\varepsilon_h$ and $\varepsilon_H$ as empirical parameters decided by fitting log derived stress results with DFIT (Diagnostic Fracture Injection Testing) data.

Statement 7: The method according to any one of Statements 1 to 6, wherein the fracture productivity indicator EPA is calculated from the neural network model at different input fracturing treatment parameters, wherein the EPA is a propped payzone area within which the conductivity is no less than the critical conductivity, and wherein a critical conductivity is a minimum conductivity beyond which a fracture behaves like infinite conductive, and wherein the critical conductivity increases with at least one of an increasing reservoir permeability, increasing propped length and decreasing production time.

Statement 8: The method according to any one of Statements 1 to 7, further comprising converting the neural network predicted EPA to ROFI based on a linear transient flow theory or boundary dominant flow theory, wherein at least one of the linear transient theory or the boundary dominant flow theory is based on an assumption of a single phase fluid, a homogeneous reservoir, and no time effect on petrophysical properties and fluid properties associated with the portion of shale rocks.

Statement 9: The method according to any one of Statements 1 to 8, wherein a natural fracture effect is accounted for in at least one of the linear transient theory or the boundary dominant flow theory.

Statement 10: The method according to any one of Statements 1 to 9, wherein the mechanical properties comprise Poisson's ratio and Young's modulus.

Statement 11: The method according to any of Statements 1-10, wherein the one or more treatment parameter values comprise at least one of a slurry injection rate, a total slurry volume, and a perforation depth.

Statement 12: The method according to any of Statements 1-11, further comprising based on the ROFI, generating a parametric study for one or more wells in a same geological area in near real-time.

Statement 13: A system comprising: one or more processors, and one or more computer-readable storage media having stored thereon instructions which, when executed by the one or more processors, cause the one or more processors to: calculate, based on sonic data and density data, mechanical properties and closure stress of a portion of shale rocks for fracture modeling; generate one or more rock mechanical models based on the mechanical properties and closure stress of the portion of shale rocks; perform one or more fracture modeling simulations based on one or more treatment parameter values; based on the one or more fracture modeling simulations, generate a neural network model which predicts a fracture productivity indicator of at least one of an effective propped area (EPA) and an effective propped length (EPL); and calculate a return-on-fracturing-investment (ROFI) based on the EPA or EPL predicted by the neural network model.

Statement 14: A system according to Statement 13, wherein calculating the mechanical properties is based on at least one of an isotropic acoustic model, a Stoneley anisotropic acoustic model, and a non-Stoneley model.

Statement 15: A system according to Statement 13 and/or Statement 14, the one or more computer-readable storage media having stored thereon instructions which, when executed by the one or more processors, cause the one or more processors to: interpret a stiffness tensor associated with the portion of shale rocks based on the at least one of the isotropic acoustic model, the Stoneley anisotropic acoustic model, and the non-Stoneley model.

Statement 16: A system according to any of Statements 13 through 15, the one or more computer-readable storage media having stored thereon instructions which, when executed by the one or more processors, cause the one or more processors to: calculate a horizontal and vertical Young's modulus and Poisson's ratio and the fracture closure stress, the one or more fracture modeling simulations being based on the horizontal and vertical Young's modulus and Poisson's ratio.

Statement 17: A non-transitory computer-readable storage medium comprising: instructions which, when executed by one or more processors, cause the one or more processors to: calculate, based on sonic data and density data, mechanical properties and closure stress of a portion of shale rocks for fracture modeling; generate one or more rock mechanical models based on the mechanical properties and closure stress of the portion of shale rocks; perform one or more fracture modeling simulations based on one or more treatment parameter values; based on the one or more fracture modeling simulations, generate a neural network model which predicts a fracture productivity indicator of at least one of an effective propped area (EPA) and an effective propped length (EPL); and calculate a return-on-fracturing-investment (ROFI) based on the EPA or EPL predicted by the neural network model.

Statement 18: A non-transitory computer-readable storage medium according to Statement 17, wherein the fracture productivity indicator EPA is calculated from the neural network model at different input fracturing treatment parameters, wherein the EPA is a propped payzone area within which the conductivity is no less than the critical conductivity, and wherein a critical conductivity is a minimum conductivity beyond which a fracture behaves like infinite conductive, and wherein the critical conductivity increases with at least one of an increasing reservoir permeability, increasing propped length and decreasing production time.

Statement 19: A non-transitory computer-readable storage medium according to Statement 17 and/or Statement 18, wherein the mechanical properties comprise Poisson's ratio and Young's modulus, and wherein the one or more treatment parameter values comprise at least one of a slurry injection rate, a total slurry volume, and a perforation depth.

Statement 20: A non-transitory computer-readable storage medium according to any of Statements 17 through 19, storing additional instructions which, when executed by the one or more processors, cause the one or more processors to calculate the mechanical properties is based on at least one of an isotropic acoustic model, a Stoneley anisotropic acoustic model, and a non-Stoneley model.

Statement 21: A non-transitory computer-readable storage medium storing instructions which, when executed by a computing device, cause the computing device to perform a method according to any of Statements 1-12.

Statement 22: A system configured to perform a method according to any of Statements 1-12.

What is claimed:
1. A method comprising:
 calculating, based on sonic data and density data, mechanical properties and closure stress of a portion of shale rocks for fracture modeling;
 generating, via a processor, one or more rock mechanical models based on the mechanical properties and closure stress of the portion of shale rocks;
 performing, via the processor, one or more fracture modeling simulations based on one or more treatment parameter values;
 based on the one or more fracture modeling simulations, generating, via the processor, a neural network model which predicts a fracture productivity indicator of at least one of an effective propped area (EPA) and an effective propped length (EPL);
 calculating a return-on-fracturing-investment (ROFI) based on the EPA or EPL predicted by the neural network model based on a linear transient flow theory or boundary dominant flow theory;
 generating a parametric study for other wells in the same geological area in real-time or near real-time based on the calculated ROFI; and
 optimizing a pumping volume at different stages based on the calculated ROFI.

2. The method of claim 1, wherein calculating the mechanical properties is based on at least one of an isotropic acoustic model, a Stoneley anisotropic acoustic model, and a non Stoneley model.

3. The method of claim 2, further comprising interpreting a stiffness tensor associated with the portion of shale rocks based on the at least one of the isotropic acoustic model, the Stoneley anisotropic acoustic model, and the non-Stoneley model.

4. The method of claim 3, further comprising interpreting stiffness coefficients and shale anisotropy from the sonic data.

5. The method of claim 3, further comprising calculating a horizontal and vertical Young's modulus and Poisson's ratio and a fracture closure stress, the one or more fracture modeling simulations being based on the horizontal and vertical Young's modulus and Poisson's ratio.

6. The method of claim 5, wherein a fracture closure stress is based on a stress equation having strains $\varepsilon_h$ and $\varepsilon_H$ as empirical parameters decided by fitting log derived stress results with DFIT (Diagnostic Fracture Injection Testing) data.

7. The method of claim 1, wherein the fracture productivity indicator EPA is calculated from the neural network model at different input fracturing treatment parameters, wherein the EPA is a propped payzone area within which a conductivity is no less than a critical conductivity, and wherein the critical conductivity is a minimum conductivity beyond which a fracture behaves like infinite conductive, and wherein the critical conductivity increases with at least one of an increasing reservoir permeability, increasing propped length and decreasing production time.

8. The method of claim 1, wherein at least one of the linear transient theory or the boundary dominant flow theory is based on an assumption of a single phase fluid, a homogeneous reservoir, and no time effect on petrophysical properties and fluid properties associated with the portion of shale rocks.

9. The method of claim 8, wherein a natural fracture effect is accounted for in at least one of the linear transient theory or the boundary dominant flow theory.

10. The method of claim 1, wherein the mechanical properties comprise Poisson's ratio and Young's modulus.

11. The method of claim 10, wherein the one or more treatment parameter values comprise at least one of a slurry injection rate, a total slurry volume, and a perforation depth.

12. A system comprising:
one or more processors; and
one or more computer-readable storage media having stored thereon instructions which, when executed by the one or more processors, cause the one or more processors to:
calculate, based on sonic data and density data, mechanical properties and closure stress of a portion of shale rocks for fracture modeling;
generate one or more rock mechanical models based on the mechanical properties and closure stress of the portion of shale rocks;
perform one or more fracture modeling simulations based on one or more treatment parameter values;
based on the one or more fracture modeling simulations, generate a neural network model which predicts a fracture productivity indicator of at least one of an effective propped area (EPA) and an effective propped length (EPL);
calculate a return-on-fracturing-investment (ROFI) based on the EPA or EPL predicted by the neural network model based on a linear transient flow theory or boundary dominant flow theory;
generate a parametric study for other wells in the same geological area in real-time or near real-time based on the calculated ROFI; and
optimize a pumping volume at different stages based on the calculated ROFI.

13. The system of claim 12, wherein calculating the mechanical properties is based on at least one of an isotropic acoustic model, a Stoneley anisotropic acoustic model, and a non-Stoneley model.

14. The system of claim 13, the one or more computer-readable storage media having stored thereon instructions which, when executed by the one or more processors, cause the one or more processors to: interpret a stiffness tensor associated with the portion of shale rocks based on the at least one of the isotropic acoustic model, the Stoneley anisotropic acoustic model, and the non-Stoneley model.

15. The system of claim 14, the one or more computer-readable storage media having stored thereon instructions which, when executed by the one or more processors, cause the one or more processors to: calculate a horizontal and vertical Young's modulus and Poisson's ratio and a fracture closure stress, the one or more fracture modeling simulations being based on the horizontal and vertical Young's modulus and Poisson's ratio.

16. A non-transitory computer-readable storage medium comprising:
instructions which, when executed by one or more processors, cause the one or more processors to:
calculate, based on sonic data and density data, mechanical properties and closure stress of a portion of shale rocks for fracture modeling;
generate one or more rock mechanical models based on the mechanical properties and closure stress of the portion of shale rocks;
perform one or more fracture modeling simulations based on one or more treatment parameter values;
based on the one or more fracture modeling simulations, generate a neural network model which predicts a fracture productivity indicator of at least one of an effective propped area (EPA) and an effective propped length (EPL);
calculate a return-on-fracturing-investment (ROFI) based on the EPA or EPL predicted by the neural network model based on a linear transient flow theory or boundary dominant flow theory;
generate a parametric study for other wells in the same geological area in real-time or near real-time based on the calculated ROFI; and
optimize a pumping volume at different stages based on the calculated ROFI.

17. The non-transitory computer-readable storage medium of claim 16, wherein the fracture productivity indicator EPA is calculated from the neural network model at different input fracturing treatment parameters, wherein the EPA is a propped payzone area within which a conductivity is no less than a critical conductivity, and wherein the critical conductivity is a minimum conductivity beyond which a fracture behaves like infinite conductive, and wherein the critical conductivity increases with at least one of an increasing reservoir permeability, increasing propped length and decreasing production time.

18. The non-transitory computer-readable storage medium of claim 16, wherein the mechanical properties comprise Poisson's ratio and Young's modulus, and wherein the one or more treatment parameter values comprise at least one of a slurry injection rate, a total slurry volume, and a perforation depth.

19. The non-transitory computer-readable storage medium of claim 16, storing additional instructions which, when executed by the one or more processors, cause the one or more processors to calculate the mechanical properties is based on at least one of an isotropic acoustic model, a Stoneley anisotropic acoustic model, and a non-Stoneley model.

* * * * *